United States Patent
Zhu et al.

(10) Patent No.: US 9,013,001 B2
(45) Date of Patent: Apr. 21, 2015

(54) STRESS-GENERATING SHALLOW TRENCH ISOLATION STRUCTURE HAVING DUAL COMPOSITION

(71) Applicant: International Business Machines Corporation, Armonk, NY (US)

(72) Inventors: Huilong Zhu, Poughkeepsie, NY (US); Jing Wang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 13/947,677

(22) Filed: Jul. 22, 2013

(65) Prior Publication Data

US 2013/0307077 A1 Nov. 21, 2013

Related U.S. Application Data

(62) Division of application No. 11/940,531, filed on Nov. 15, 2007, now Pat. No. 8,492,846.

(51) Int. Cl.
| | |
|---|---|
| H01L 21/62 | (2006.01) |
| H01L 23/58 | (2006.01) |
| H01L 27/088 | (2006.01) |
| H01L 29/78 | (2006.01) |
| H01L 21/308 | (2006.01) |
| H01L 21/3105 | (2006.01) |
| H01L 21/762 | (2006.01) |

(Continued)

(52) U.S. Cl.
CPC ........ *H01L 29/7846* (2013.01); *H01L 21/3081* (2013.01); *H01L 21/31053* (2013.01); *H01L 21/76224* (2013.01); *H01L 21/823807* (2013.01); *H01L 21/823878* (2013.01); *H01L 27/092* (2013.01); *H01L 2924/0002* (2013.01)

(58) Field of Classification Search
USPC .................. 257/369, 368, 510, 351, E23.002, 257/E21.546
See application file for complete search history.

(56) References Cited

U.S. PATENT DOCUMENTS

| | | | |
|---|---|---|---|
| 3,602,841 | A | 8/1971 | McGroddy |
| 4,665,415 | A | 5/1987 | Esaki et al. |

(Continued)

FOREIGN PATENT DOCUMENTS

| | | |
|---|---|---|
| CN | 1591826 A | 3/2005 |
| JP | 6476755 | 3/1989 |

OTHER PUBLICATIONS

Notice of Allowance dated Jan. 8, 2014 received in related U.S. Application, namely U.S. Appl. No. 13/419,927.

(Continued)

*Primary Examiner* — Cathy N Lam
(74) *Attorney, Agent, or Firm* — Scully, Scott, Murphy & Presser, P.C.; Yuanmin Cai

(57) ABSTRACT

A shallow trench isolation structure containing a first shallow trench isolation portion comprising the first shallow trench material and a second shallow trench isolation portion comprising the second shallow trench material is provided. A first biaxial stress on at least one first active area and a second bidirectional stress on at least one second active area are manipulated separately to enhance charge carrier mobility in middle portions of the at least one first and second active areas by selection of the first and second shallow trench materials as well as adjusting the type of the shallow trench isolation material that each portion of the at least one first active area and the at least one second active area laterally abut.

15 Claims, 38 Drawing Sheets

(51) Int. Cl.
*H01L 21/8238* (2006.01)
*H01L 27/092* (2006.01)

(56) References Cited

U.S. PATENT DOCUMENTS

| | | |
|---|---|---|
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 4,969,023 A | 11/1990 | Svedberg |
| 5,006,913 A | 4/1991 | Sugahara et al. |
| 5,060,030 A | 10/1991 | Hoke et al. |
| 5,081,513 A | 1/1992 | Jackson et al. |
| 5,108,843 A | 4/1992 | Ohtaka et al. |
| 5,134,085 A | 7/1992 | Gilgen et al. |
| 5,268,330 A | 12/1993 | Givens et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,583,369 A | 12/1996 | Yamazaki et al. |
| 5,592,007 A | 1/1997 | Leedy |
| 5,592,009 A | 1/1997 | Hideka |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,698,869 A | 12/1997 | Yoshimi et al. |
| 5,840,593 A | 11/1998 | Leedy |
| 5,841,170 A | 11/1998 | Adan et al. |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,255,695 B1 | 7/2001 | Kubota et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,468,872 B1 | 10/2002 | Yang |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,570,169 B2 | 5/2003 | Suguro et al. |
| 6,605,498 B1 | 8/2003 | Murthy et al. |
| 6,621,131 B2 | 9/2003 | Murthy et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,806,584 B2 | 10/2004 | Fung et al. |
| 6,815,278 B1 | 11/2004 | Ieong et al. |
| 6,825,529 B2 | 11/2004 | Chidambarrao et al. |
| 6,831,292 B2 | 12/2004 | Currie et al. |
| 6,869,866 B1 | 3/2005 | Chidambarrao et al. |
| 6,890,808 B2 | 5/2005 | Chidambarrao et al. |
| 6,930,030 B2 | 8/2005 | Rausch et al. |
| 6,964,892 B2 | 11/2005 | Clevenger et al. |
| 6,974,981 B2 | 12/2005 | Chidambarrao et al. |
| 6,977,194 B2 | 12/2005 | Belyansky et al. |
| 6,998,657 B2 | 2/2006 | Rhodes |
| 7,015,082 B2 | 3/2006 | Doris et al. |
| 7,023,018 B2 | 4/2006 | Buss |
| 7,023,055 B2 | 4/2006 | Ieong et al. |
| 7,166,528 B2 | 1/2007 | Kim et al. |
| 7,268,024 B2 | 9/2007 | Yeo et al. |
| 7,329,923 B2 | 2/2008 | Doris et al. |
| 7,429,775 B1 | 9/2008 | Nayak et al. |
| 7,528,465 B2 | 5/2009 | King et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0129791 A1 | 7/2003 | Yamazaki |
| 2003/0181005 A1 | 9/2003 | Hachimine et al. |
| 2004/0029323 A1 | 2/2004 | Shimizu et al. |
| 2004/0051144 A1 | 3/2004 | Webb et al. |
| 2004/0113174 A1 | 6/2004 | Chidambarrao et al. |
| 2004/0113217 A1 | 6/2004 | Chidambarrao et al. |
| 2004/0173815 A1 | 9/2004 | Yeo et al. |
| 2004/0238914 A1 | 12/2004 | Deshpande et al. |
| 2004/0262784 A1 | 12/2004 | Doris et al. |
| 2005/0017304 A1 | 1/2005 | Matsuhita |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0093104 A1* | 5/2005 | Ieong et al. .................. 257/627 |
| 2005/0098234 A1 | 5/2005 | Nakaharai et al. |
| 2005/0098829 A1 | 5/2005 | Doris et al. |
| 2005/0106799 A1 | 5/2005 | Doris et al. |
| 2005/0139929 A1 | 6/2005 | Rost |
| 2005/0145954 A1 | 7/2005 | Zhu et al. |
| 2005/0148146 A1 | 7/2005 | Doris et al. |
| 2005/0184345 A1 | 8/2005 | Lin et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0247926 A1 | 11/2005 | Sun et al. |
| 2005/0280051 A1 | 12/2005 | Chidambarrao et al. |
| 2005/0282325 A1 | 12/2005 | Belyansky et al. |
| 2006/0022266 A1 | 2/2006 | Messenger et al. |
| 2006/0027868 A1 | 2/2006 | Doris et al. |
| 2006/0057787 A1 | 3/2006 | Doris et al. |
| 2006/0060925 A1 | 3/2006 | Doris et al. |
| 2006/0094212 A1 | 5/2006 | Noguchi et al. |
| 2006/0121394 A1* | 6/2006 | Chi .............................. 430/314 |
| 2006/0177998 A1 | 8/2006 | Lin et al. |
| 2006/0246641 A1 | 11/2006 | Kammler et al. |
| 2007/0034963 A1 | 2/2007 | Sudo |

(56) References Cited

U.S. PATENT DOCUMENTS

| | | |
|---|---|---|
| 2007/0257315 A1 | 11/2007 | Bedell et al. |
| 2009/0026549 A1 | 1/2009 | Teh et al. |
| 2009/0057777 A1 | 3/2009 | Fujii et al. |

OTHER PUBLICATIONS

Rim et al., "Transductance Enhancement in Deep Submicron Strained-Si n-MOSFETs", International Electron Devices Meeting, IEEE, 1998, 26.8.1-26.8.4.

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1-34.4.4.

Ootsuka et al., "A Highly Dense, High-Performance 130nm Node CMOS Technology for Large Scale System-on-a-Chip Applications", International Electron Devices Meeting, IEEE, 2000, 23.5.1-23.5.4.

Ito et al., "Mechanical Stress Effect of Etch-Stop Nitride and its Impact on Deep Submicron Transistor Design", International Electron Devices Meeting, IEEE, 2000, 10.7.1-10.7.4.

Shimizu et al., "Local Mechanical-Stress Control (LMC): A New Technique for CMOS-Performance Enhancement", International Electron Devices Meeting, IEEE, 2001, 19.4.1-19.4.4.

Ota et al., "Novel Locally Strained Channel Technique for High Performance 55nm CMOS", International Electron Devices Meeting, IEEE, 2002, pp. 27-30, 2.2.1-2.2.4.

Zhang et al. "A New 'Mixed-Mode' Reliability Degradation Mechanism in Advanced Si and SiGe Bipolar Transistors", IEEE, 2002, pp. 2151-2156.

Momose et al., "Temperature Dependence of Emitter-Base Reverse Stress Degradation and its Mechanism Analyzed by MOS Structures", IEEE, Paper 6.2, 1989, pp. 140-143.

Huang et al., "Temperature Dependence and Post-Stress Recovery of Hot Electron Degradation Effects in Bipolar Transistors", Bipolar Circuits and technology Meeting 7.5, IEEE, 1991, pp. 170-173.

Sheng et al., "Degradation and Recovery of SiGe HBTs Following Radiation and Hot-Carrier Stressing", pp. 14-15.

Yang et al., "Avalanche Current Induced Hot Carrier Degradation in 200GHz SiGe Heterojunction Bipolar Transistors".

Li et al., "Design of W-Band VCOs with high Output Power for Potential Application in 77GHz Automotive Radar Systems", GaAs Digest, IEEE, 2003, pp. 263-266.

Wurzer et al. "Annealing of Degraded npn-Transistors-Mechanisms and Modeling", Transactions on Electron Devices, IEEE, 1994, pp. 533-538, vol. 41, No. 4.

Doyle et al., "Recovery of Hot-Carrier Damage in Reoxidized Nitrided Oxide MOSFET's" Electron Device Letters, IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "SiGe HBT Technology with Fmax/Ft=350/300 GHz and Gate Delay Below 3.3 ps", IEEE, 2004.

Bean et al., "GEx Si1-x/Si Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si-Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl. Phys., 1988, pp. 3043-3050, vol. 64, No. 6.

Houghton et al., "Equilibrium Critical Thickness for Si1-xGex Strained Layers on (100) Si", Appl. Phys. Lett., 1990, pp. 460-462, vol. 56, No. 29.

Ouyang et al., "Two-Dimensional Bandgap Engineering in a Novel Si/SiGe pMOSFET With Enhanced Device Performance and Scalability," IEEE, 2000, pp. 151-154.

\* cited by examiner

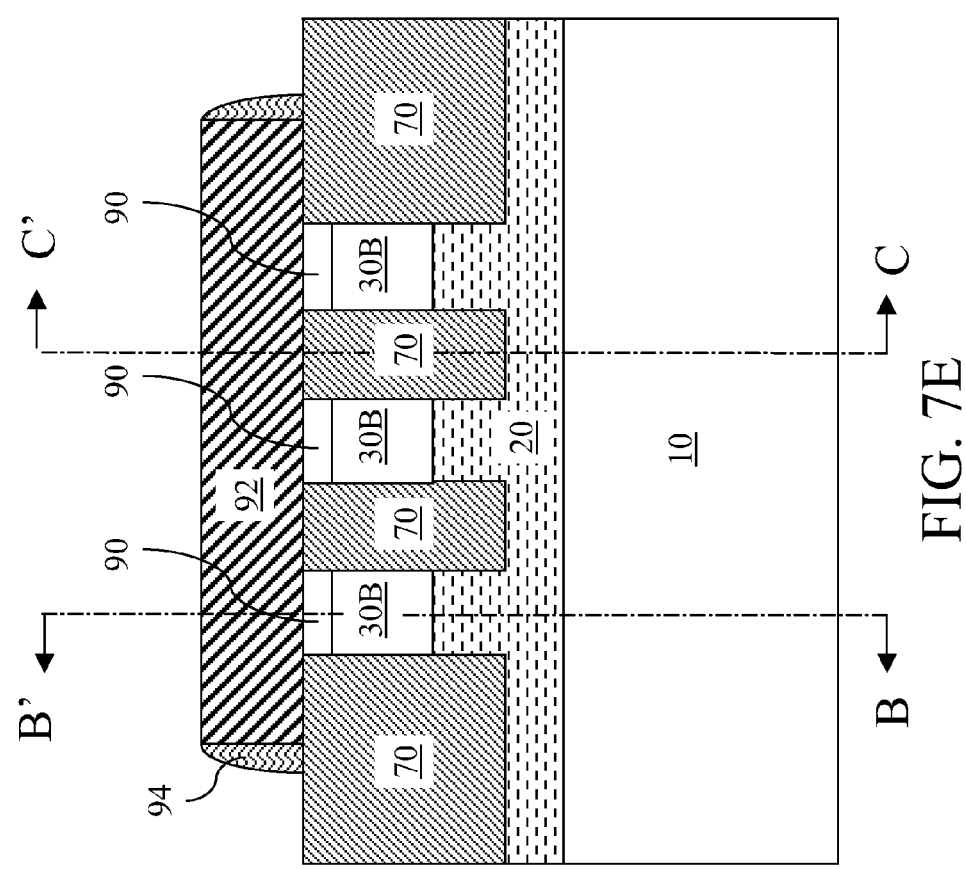

STRESS-GENERATING SHALLOW TRENCH ISOLATION STRUCTURE HAVING DUAL COMPOSITION

CROSS REFERENCE TO RELATED APPLICATION

This application is a divisional of U.S. patent application Ser. No. 11/940,531, filed Nov. 15, 2007 the entire content and disclosure of which is incorporated herein by reference.

FIELD OF THE INVENTION

The present invention relates to a stress-generating shallow trench isolation structure having a dual composition and methods of manufacturing the same.

BACKGROUND OF THE INVENTION

Manipulating stress is an effective way of improving charge carrier mobility in a metal oxide semiconductor field effect transistor (MOSFET) and increasing the transconductance (or reduced serial resistance) of the MOSFET that requires relatively small modifications to semiconductor processing while providing significant enhancement to MOSFET performance.

When stress is applied to the channel of a semiconductor transistor, the mobility of carriers, and as a consequence, the transconductance and the on-current of the transistor are altered from their original values for an unstressed semiconductor. This is because the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress.

The effect of stress on the performance of semiconductor devices, especially on the performance of a MOSFET (or a "FET" for short) device built on a silicon substrate, has been extensively studied in the semiconductor industry. The response of the performance of the MOSFET depends on the direction and type of the stress. For example, in a PMOSFET (or a "PFET" in short) utilizing a silicon channel having current flow in a [110] orientation and formed in a (001) silicon substrate, the mobility of minority carriers in the channel (which are holes in this case) increases under a longitudinal compressive stress along the direction of the channel, i.e., the direction of the movement of holes or the direction connecting the drain to the source. Conversely, in an NMOSFET (or an "NFET" for short) utilizing a silicon channel having current flow in a [110] orientation and formed in a (001) silicon substrate, the mobility of minority carriers in the channel (which are electrons in this case) increases under longitudinal tensile stress along the direction of the channel, i.e., the direction of the movement of electrons or the direction connecting the drain to the source. The direction of a longitudinal stress for enhancing the carrier mobility is opposite between the PMOSFET and NMOSFET.

In contrast, enhancement of carrier mobility by a transverse stress on a MOSFET utilizing a silicon channel having current flow in the [110] orientation and formed in the (001) silicon substrate requires a tensile transverse stress irrespective of the type of the MOSFET. In other words, tensile transverse stress enhances the carrier mobility of a PMOSFET and the carrier mobility of an NMOSFET. Thus, the direction of a compressive stress for enhancing the carrier mobility is the same between the PMOSFET and NMOSFET.

Prior art stress-generating structures such as stress-generating liners formed above a semiconductor substrate and on a gate line is inefficient in transmission of a stress to a channel region of a transistor since the stress is transmitted through gate spacers, and the magnitude of the stress tends to decay rapidly with depth into the semiconductor substrate. Further, in the case of a PMOSFET, no mechanism is provided for reversing the direction of stress between the longitudinal stress and the transverse stress. In other words, if the longitudinal stress is compressive and beneficial to enhance of performance of the PMOSFET, the transverse stress is also compressive, which is disadvantageous to enhancement of performance of the PMOSFET.

In view of the above, there exists a need to efficiently transmit stress from a stress-generating structure to a channel in a transistor.

Further, there exists a need to decouple the direction of a longitudinal stress and the direction of a transverse stress applied to a channel of a transistor such that both the longitudinal stress and the transverse stress may induce advantageous effects to the mobility of charge carriers in the channel.

SUMMARY OF THE INVENTION

The present invention addresses the needs described above by providing a semiconductor structure including a shallow trench isolation structure having a dual composition in which a first shallow trench isolation structure portion and a second shallow trench isolation structure portion have different composition and have different stress-generating properties. Methods of manufacturing such a semiconductor structure are also provided.

In the present invention, an etch stop layer having etch selectivity to a first shallow trench isolation material is formed on a top surface of a semiconductor substrate. A shallow trench surrounding at least one first active area for forming a first conductivity type transistor, which may be a p-type transistor or an n-type transistor, and at least one second active area for forming an opposite conductivity type transistor is formed. The shallow trench is filled with a first shallow trench isolation material which has a first composition and first stress generating properties.

A photoresist is applied over the at least one first active area and the at least one second active area and patterned such that a portion of the first shallow trench isolation material is exposed from a middle portion of the at least one first active area and from edge portions of the at least one second active area. Exposed portions of the first shallow trench isolation material is removed by an anisotropic etch that is selective to the etch stop layer. Cavities, which are formed by removal of the first shallow trench isolation material, are filled with a second shallow trench isolation material which has a second composition and second stress-generating properties. The second shallow trench isolation material is then planarized.

A shallow trench isolation structure containing a first shallow trench isolation portion comprising the first shallow trench material and a second shallow trench isolation portion comprising the second shallow trench material is thus formed. A first biaxial stress on the at least one first active area and a second bidirectional stress on the at least one second active area are manipulated separately to enhance charge carrier mobility in middle portions of the at least one first and second active areas by selection of the first and second shallow trench materials as well as adjusting the type of the shallow trench isolation material that each portion of the at least one first active area and the at least one second active area laterally abut. The etch stop layer is removed, and a channel and a gate stack are thereafter formed on each of the at least one first and second active areas that are subjected to different types of biaxial stress. The enhanced charge carrier mobility of the middle portion of the at least one first and second active areas is advantageously employed to provide enhanced performance of both types of field effect transistors.

According to an aspect of the present invention, a semiconductor structure is provided, which comprises:

an active area comprising a semiconductor material and located in a semiconductor substrate;

a first shallow trench isolation portion laterally abutting lengthwise sidewalls of a middle portion of the active area; and a set of two second shallow trench isolation portions, each laterally abutting lengthwise sidewalls and widthwise sidewalls of end portions of the active area, wherein the first shallow trench isolation portion and the set of two second shallow trench isolation portions comprise different materials.

In one embodiment, the first shallow trench isolation portion applies a first type of stress to the lengthwise sidewalls of the middle portion of the active area, and each of the second shallow trench isolation portion applies a second type of stress to the lengthwise sidewalls and the widthwise sidewalls of the end portions of the active area, and one of the first and second types is compressive and the other of the first and second types is tensile.

In a further embodiment, one of the first shallow trench isolation portion and the set of two second shallow trench isolation portions comprises a stress-generating material that applies a stress to the active area to affect charge carrier mobility of the active area, and the other of the first shallow trench isolation portion and the set of the two second shallow trench isolation portions comprises a non-stress-generating material that does not generate a sufficient stress to affect charge carrier mobility.

In an even further embodiment, the stress-generating material is one of a tensile-stress-generating silicon nitride and a compressive-stress-generating silicon nitride, and wherein the non-stress-generating material comprises one of undoped silicate glass (USG), borosilicate glass (BSG), phosphosilicate glass (PSG), fluorosilicate glass (FSG), and borophosphosilicate glass (BPSG).

In another embodiment, one of the first shallow trench isolation portion and the set of the second shallow trench isolation portions applies a stress to the active area to affect charge carrier mobility of the active area, and the other of the first shallow trench isolation portion and the set of the second shallow trench isolation portions does not generate a stress that affects the charge carrier mobility.

In yet another embodiment, the first shallow trench isolation portion comprises a tensile-stress-generating material and the two second shallow trench isolation portions comprise a compressive-stress-generating material.

In still another embodiment, the tensile-stress-generating material is a tensile-stress-generating silicon nitride, and the compressive-stress-generating material is a compressive-stress-generating silicon nitride.

In still yet another embodiment, the first shallow trench isolation portion comprises a compressive-stress-generating material and the second shallow trench isolation portions comprise a tensile-stress-generating material.

In a further embodiment, the semiconductor structure further comprises:

a gate dielectric and a gate electrode located on the active area; and a channel located in the active area and vertically abutting the gate dielectric, wherein the first shallow trench isolation portion and the set of the second shallow trench isolation portions apply a first longitudinal stress along a lengthwise direction in the channel and a second transverse stress along a widthwise direction of the channel, wherein one of the first longitudinal stress and the second transverse stress is compressive, and wherein the other of the first longitudinal stress and the second transverse stress is tensile.

In an even further embodiment, the semiconductor structure further comprises:

a gate dielectric and a gate electrode located on the active area; and a channel located in the active area and vertically abutting the gate dielectric, wherein the first shallow trench isolation portion and the set of the second shallow trench isolation portions apply a first compressive longitudinal stress along a lengthwise direction in the channel and a second compressive transverse stress along a widthwise direction of the channel.

In a yet further embodiment, the semiconductor structure further comprises:

a gate dielectric and a gate electrode located on the active area; and a channel located in the active area and vertically abutting the gate dielectric, wherein the first shallow trench isolation portion and the set of the second shallow trench isolation portions apply a first tensile longitudinal stress along a lengthwise direction in the channel and a second tensile transverse stress along a widthwise direction of the channel.

In a still further embodiment, the active area is single crystalline.

In a still yet further embodiment, the active area is a portion of a top semiconductor layer of a semiconductor-on-insulator (SOI) substrate.

In further another embodiment, the active area is a portion of a bulk substrate.

In even further another embodiment, the first shallow trench isolation portion and the second shallow trench isolation portions have substantially the same depth.

In yet further another embodiment, each of the second shallow trench isolation portions laterally abut the first shallow trench isolation portion.

According to another aspect of the present invention, another semiconductor structure is provided, which comprises:

a first active area and a second active area, each comprising a semiconductor material and located in a semiconductor substrate and disjoined from each other;

a first shallow trench isolation portion laterally abutting lengthwise sidewalls and widthwise sidewalls of end portions of the first active area and laterally abutting lengthwise sidewalls of a middle portion of the second active area; and a second shallow trench isolation portion laterally abutting lengthwise sidewalls and widthwise sidewalls of end portions of the second active area and laterally abutting lengthwise sidewalls of a middle portion of the first active area.

In one embodiment, the first shallow trench isolation portion applies a first type of stress to the lengthwise sidewalls and the widthwise sidewalls of the end portions of the first active area and the lengthwise sidewalls of the middle portion of the second active area, and the second shallow trench isolation portion applies a second type of stress to the lengthwise sidewalls and the widthwise sidewalls of the end portions of the second active area and the lengthwise sidewalls of the middle portion of the first active area, and one of the first and second types is compressive and the other of the first and second types is tensile.

In a further embodiment, one of the first shallow trench isolation portion and the second shallow trench isolation portion comprises a stress-generating material that applies a compressive stress or a tensile stress to an abutting portion of the first active area and the second active area, and the other of the first shallow trench isolation portion and the second shallow trench isolation portion comprises a non-stress-generating material that does not generate a sufficient stress to affect charge carrier mobility.

In an even further embodiment, the stress-generating material is one of a tensile-stress-generating silicon nitride and a compressive-stress-generating silicon nitride, and wherein the non-stress-generating material comprises one of undoped silicate glass (USG), borosilicate glass (BSG), phosphosilicate glass (PSG), fluorosilicate glass (FSG), and borophosphosilicate glass (BPSG).

In another embodiment, the first shallow trench isolation portion and the second shallow trench isolation portion collectively enhance electron mobility along a lengthwise direction of the first active area and a hole mobility along a lengthwise direction of the second active area.

In even another embodiment, the first shallow trench isolation portion comprises a tensile-stress-generating material and the second shallow trench isolation portion comprises a compressive-stress-generating material.

In yet another embodiment, the tensile-stress-generating material is a tensile-stress-generating silicon nitride, and the compressive-stress-generating material is a compressive-stress-generating silicon nitride.

In still another embodiment, the first shallow trench isolation portion comprises a compressive-stress-generating material and the second shallow trench isolation portion comprises a tensile-stress-generating material.

In a further embodiment, the semiconductor structure further comprises:
a first gate dielectric and a first gate electrode located on the first active area;
a second gate dielectric and a second gate electrode located on the second active area;
a first channel located in the first active area and vertically abutting the first gate dielectric, wherein the first shallow trench isolation portion and the second shallow trench isolation portion apply a first longitudinal stress along a lengthwise direction in the first channel and a first transverse stress along a widthwise direction of the first channel; and
a second channel located in the second active area and vertically abutting the second gate dielectric, wherein the first shallow trench isolation portion and the second shallow trench isolation portion apply a second longitudinal stress along a lengthwise direction in the second channel and a second transverse stress along a widthwise direction of the second channel.

In an even further embodiment, one of the first longitudinal stress and the second longitudinal stress is compressive, and wherein the other of the first longitudinal stress and the second longitudinal stress is tensile, and the first transverse stress and the second transverse stress are both compressive or both tensile.

In a yet further embodiment, the active area is single crystalline.

In a still further embodiment, the active area is a portion of a top semiconductor layer of a semiconductor-on-insulator (SOI) substrate.

In a still yet further embodiment, the active area is a portion of a bulk substrate.

In further another embodiment, the first shallow trench isolation portion and the second shallow trench isolation portion have substantially the same depth.

In even further another embodiment, the second shallow trench isolation portion comprises two disjoined second shallow trench isolation sub-portions, each of which laterally abuts the first shallow trench isolation portion.

According to yet another aspect of the present invention, a method of fabricating a semiconductor structure is provided, which comprises:
forming an etch stop layer on a semiconductor substrate;
forming a shallow trench surrounding a first active area and a second active area in the semiconductor substrate;
filling the shallow trench with a first shallow trench isolation material having a first composition and first stress-generating properties;
forming first cavities laterally abutting lengthwise sidewalls and widthwise sidewalls of end portions of the second active area and second cavities laterally abutting lengthwise sidewalls of a middle portion of the first active area; and
filling the first cavities and second cavities with a second shallow trench isolation material having a second composition and second stress-generating properties, wherein the first stress-generating properties and second stress-generating properties are different.

In one embodiment, the method further comprises:
planarizing the first shallow trench isolation material after the filling of the shallow trench; and
planarizing the second shallow trench isolation material after the filling of the first cavities and the second cavities.

In another embodiment, one of the first shallow trench isolation material and the second shallow trench isolation material applies a stress to the active area to affect charge carrier mobility of the active area, and the other of the first shallow trench isolation material and the second shallow trench isolation material does not generate a stress that affects the charge carrier mobility.

In even another embodiment, the first shallow trench isolation material comprises a tensile-stress-generating material and the second shallow trench isolation material comprises a compressive-stress-generating material.

In yet another embodiment, the tensile-stress-generating material is a tensile-stress-generating silicon nitride, and the compressive-stress-generating material is a compressive-stress-generating silicon nitride.

In still another embodiment, the first shallow trench isolation material comprises a compressive-stress-generating material and the second shallow trench isolation material comprises a tensile-stress-generating material.

In a further embodiment, the method further comprises:
forming a first gate dielectric and a first gate electrode on the first active area;
forming a second gate dielectric and a second gate electrode on the second active area;
forming a first channel in the first active area, wherein the first shallow trench isolation material and the second shallow trench isolation material apply a first longitudinal stress along a lengthwise direction in the first channel and a first transverse stress along a widthwise direction of the first channel; and
forming a second channel in the second active area, wherein the first shallow trench isolation material and the second shallow trench isolation material apply a second longitudinal stress along a lengthwise direction in the second channel and a second transverse stress along a widthwise direction of the second channel.

In an even further embodiment, one of the first longitudinal stress and the second longitudinal stress is compressive, and the other of the first longitudinal stress and the second longitudinal stress is tensile, and wherein the first transverse stress and the second transverse stress are both compressive or both tensile.

BRIEF DESCRIPTION OF THE DRAWINGS

FIG. 1 is a vertical cross-sectional view of the first exemplary semiconductor structure. Figures with the suffix "A" are top-down views. Figures with the suffix "B," "C," "D," or "E" are vertical cross-sectional views along the plane B-B', C-C', D-D', or E-E' respectively, of the corresponding figure with the same numeric label and the suffix "A."

FIGS. 7A-7E are views of a second exemplary semiconductor structure according to a second embodiment of the present invention. FIG. 7A is a top-down view. FIGS. 7B-7E are vertical cross-sectional views along the plane B-B', C-C', D-D', or E-E' respectively.

FIG. 8A is a top-down view. FIGS. 8B-8E are vertical cross-sectional views along the plane B-B', C-C', D-D', or E-E' respectively.

DETAILED DESCRIPTION OF THE INVENTION

Figure 1:
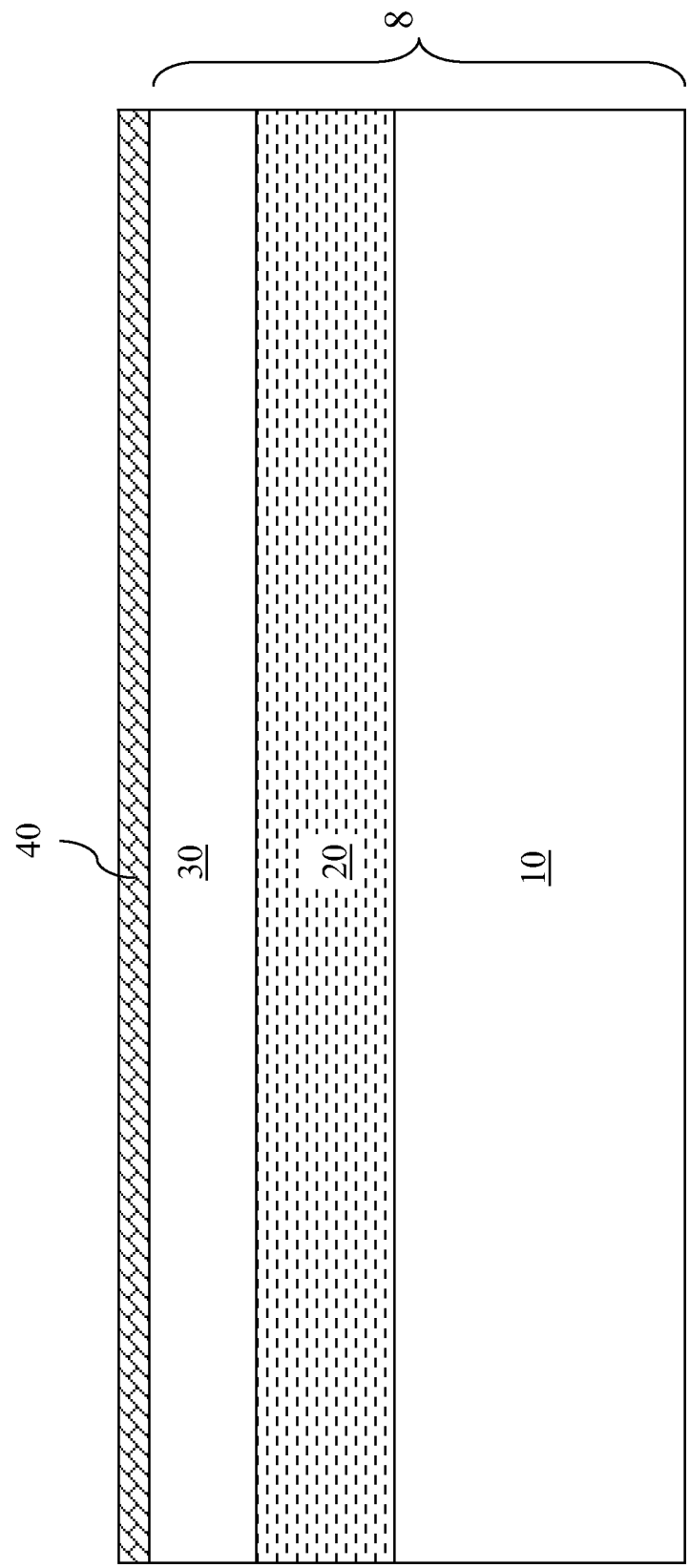
FIGS. 1-6E show sequential views of a first exemplary semiconductor structure according to a first embodiment of the present invention. Figures with the same numeric label correspond to the same stage of manufacturing.
Figure 2A:
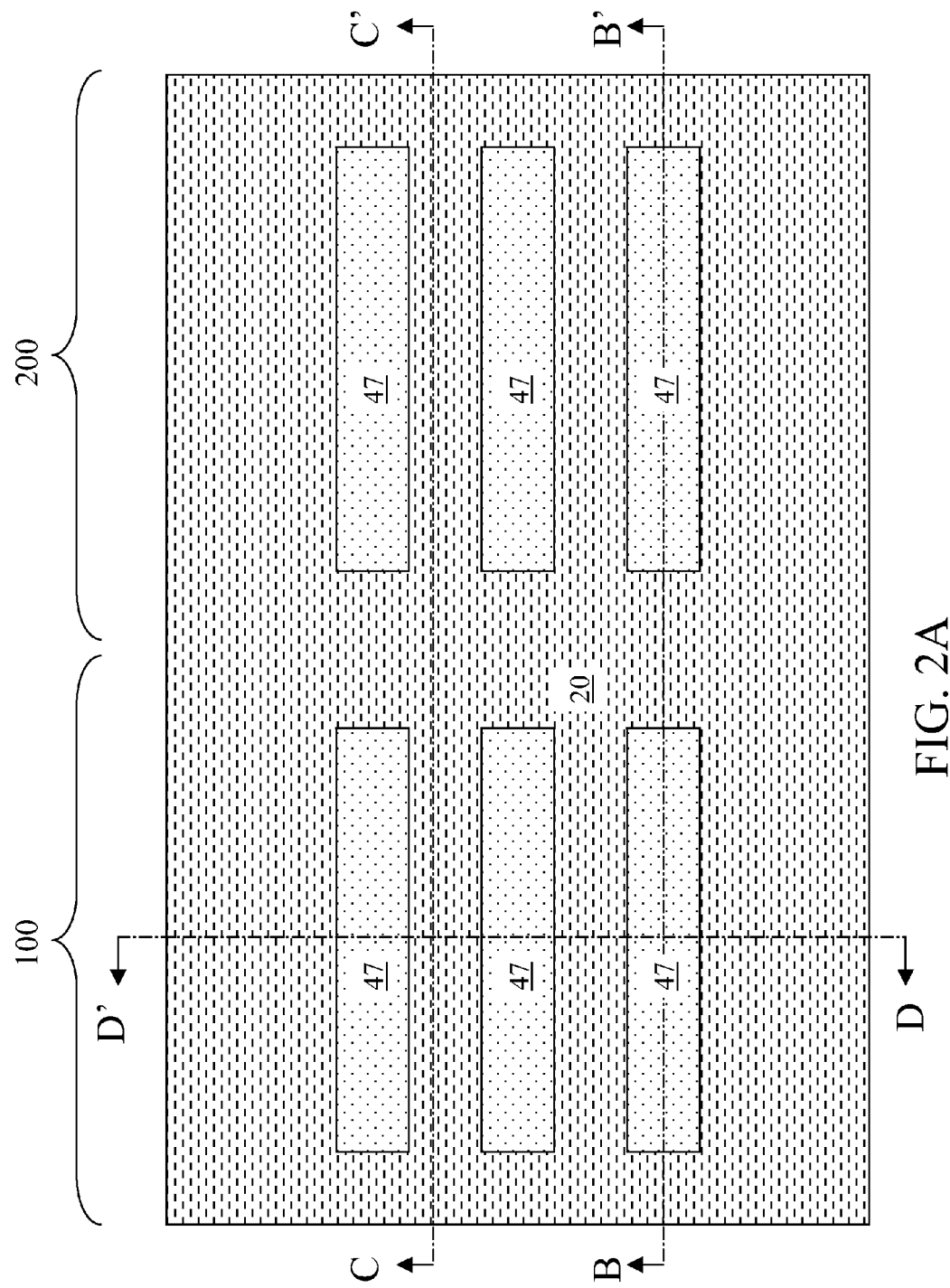
Figure 2B:
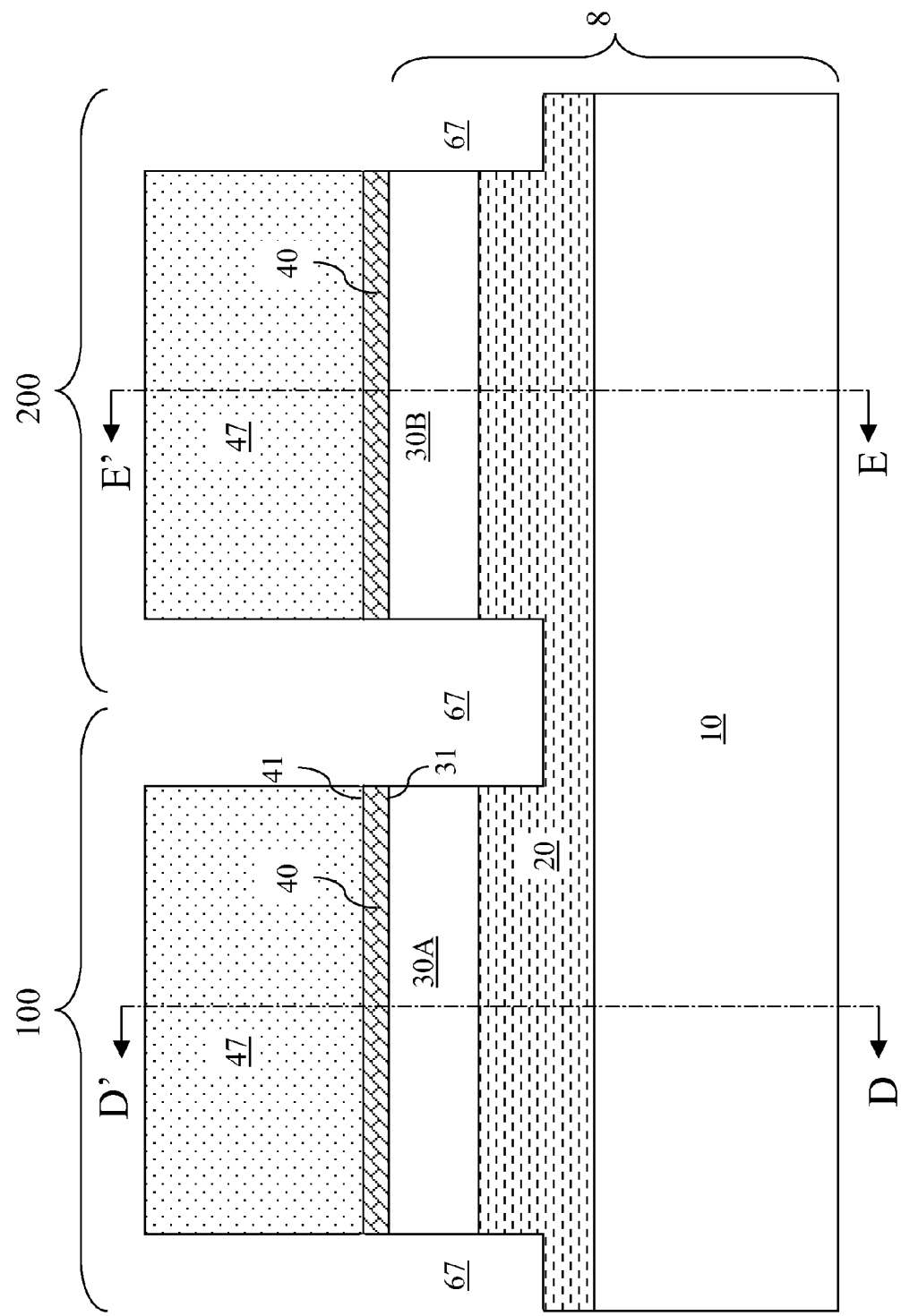
Figure 2C:
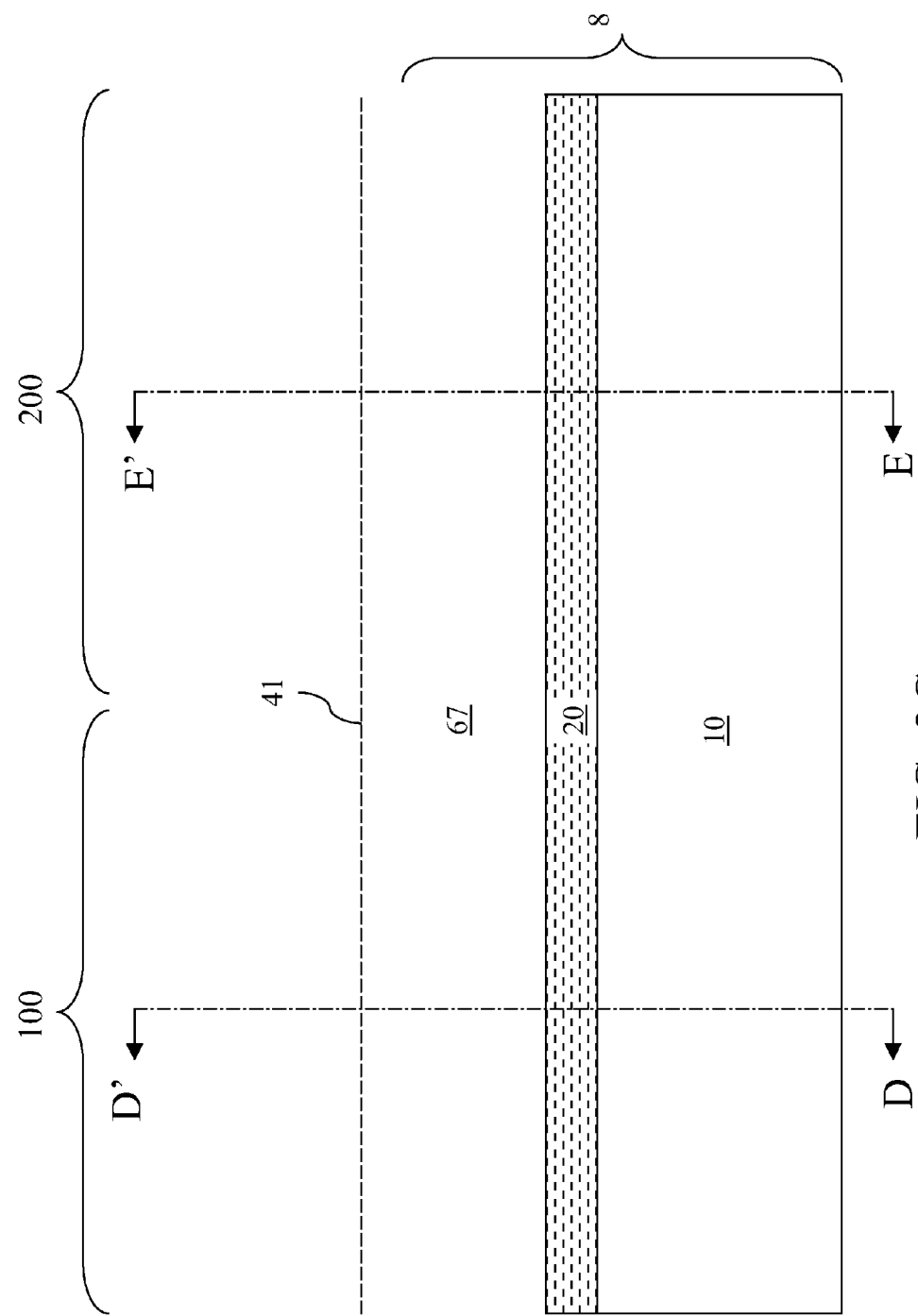
Figure 2D:
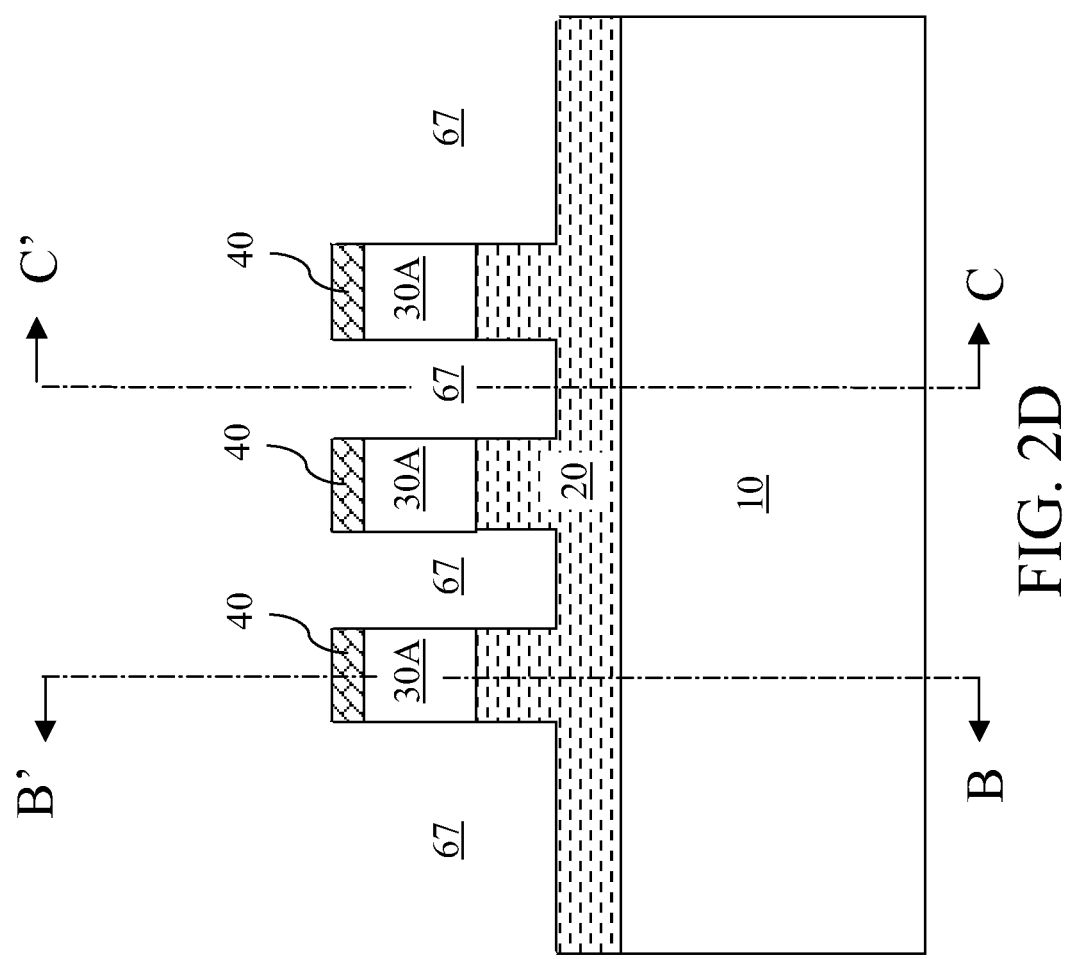
Figure 3A:
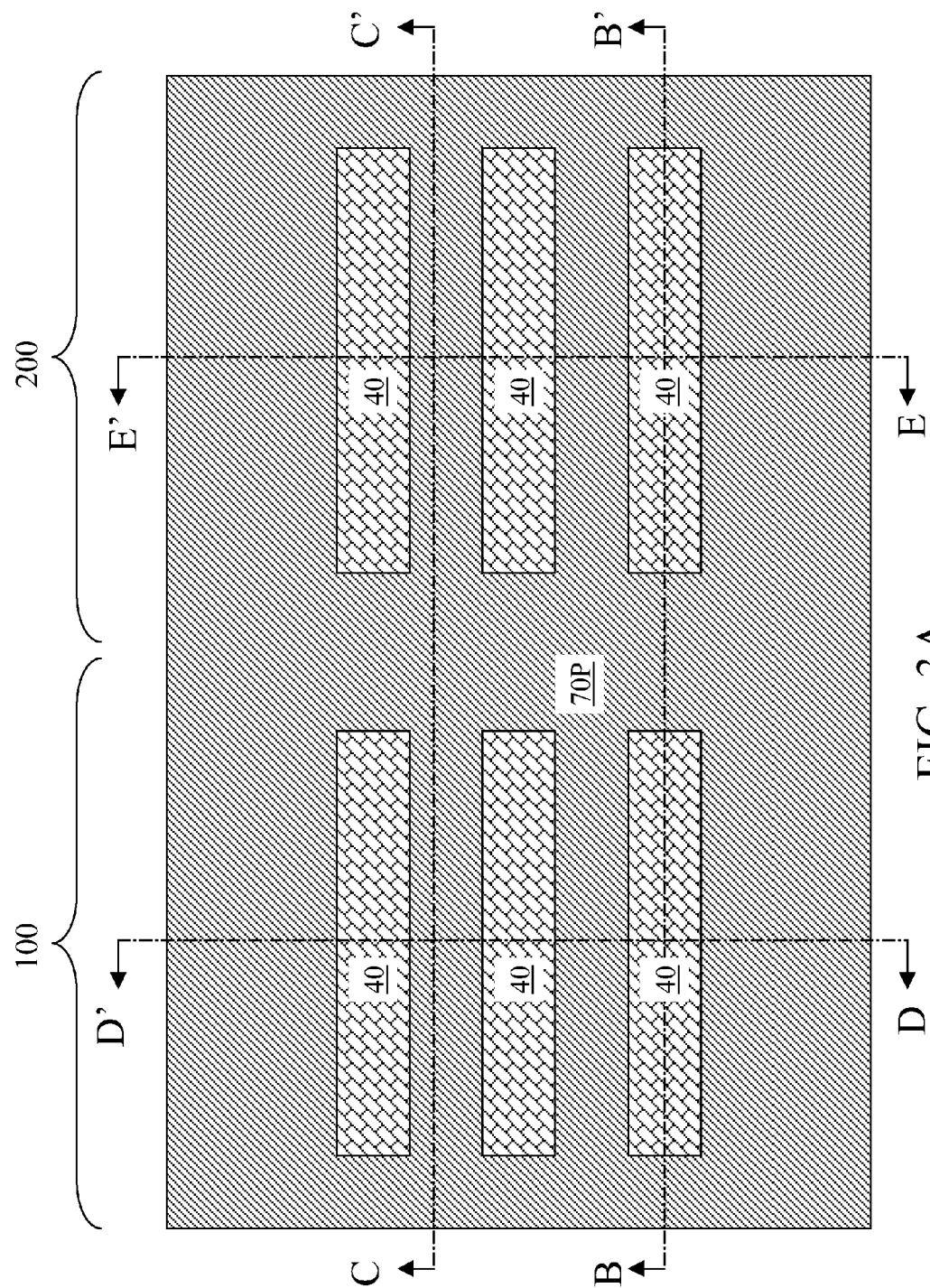
Figure 3B:
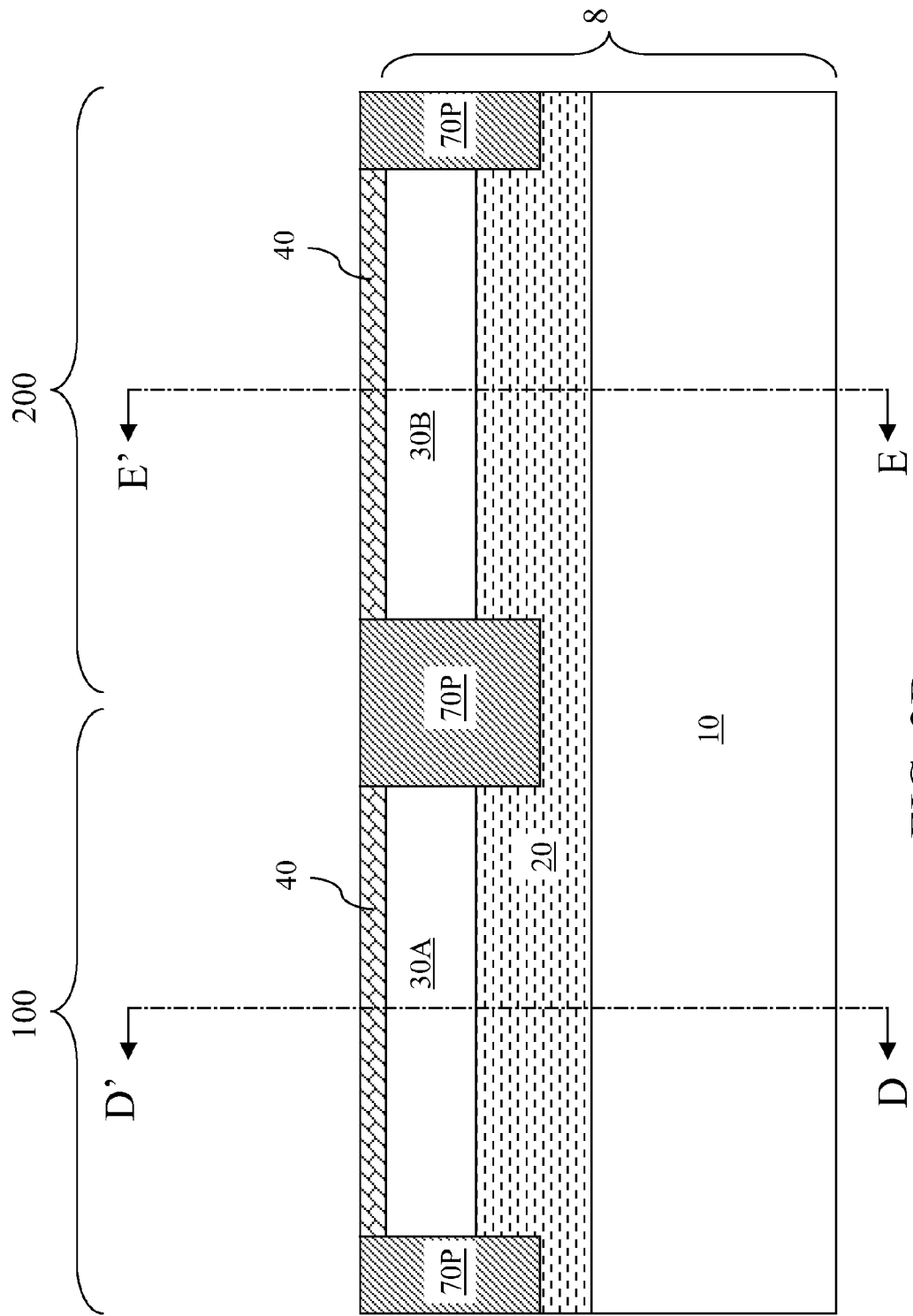
Figure 3C:
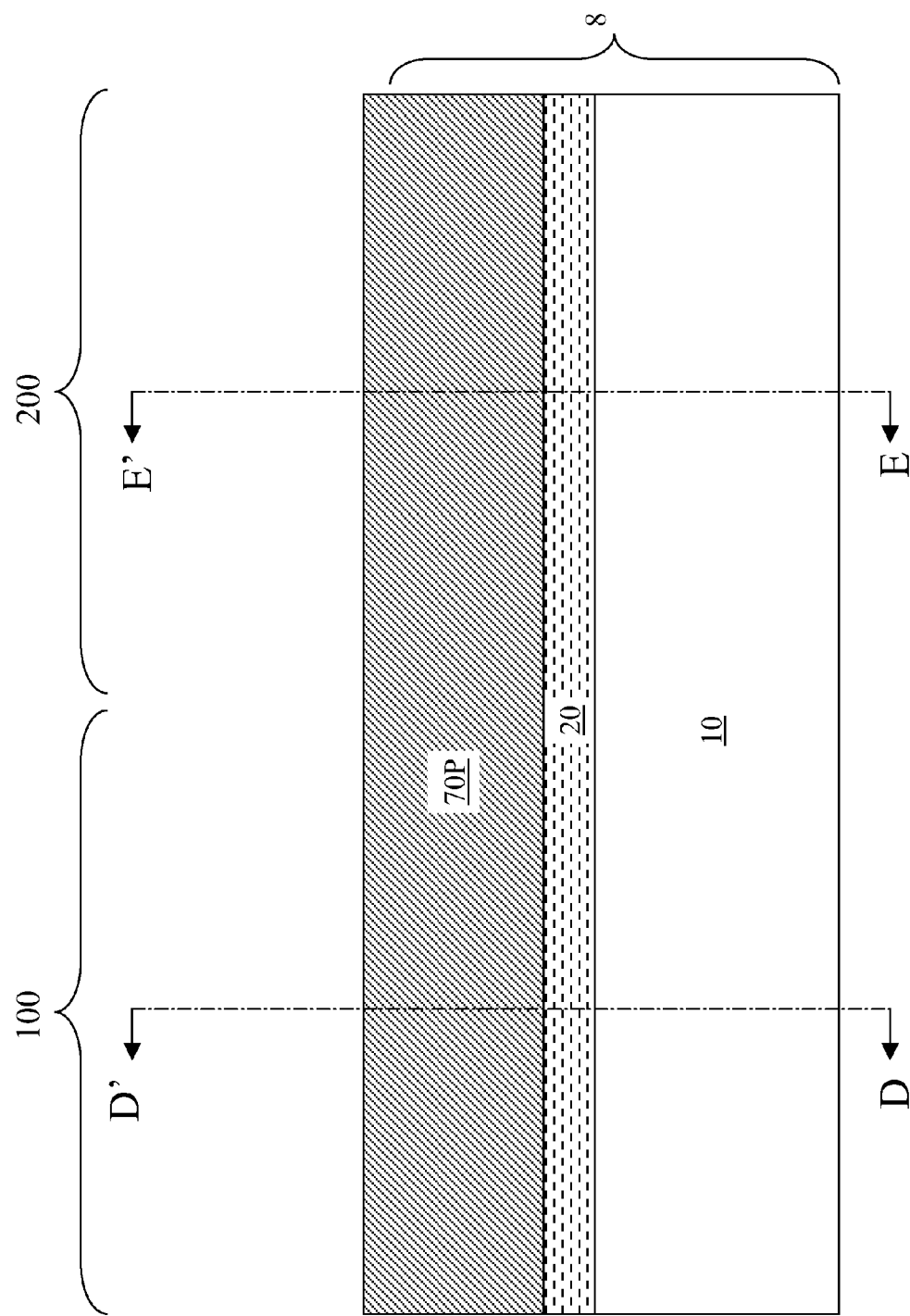
Figure 3D:
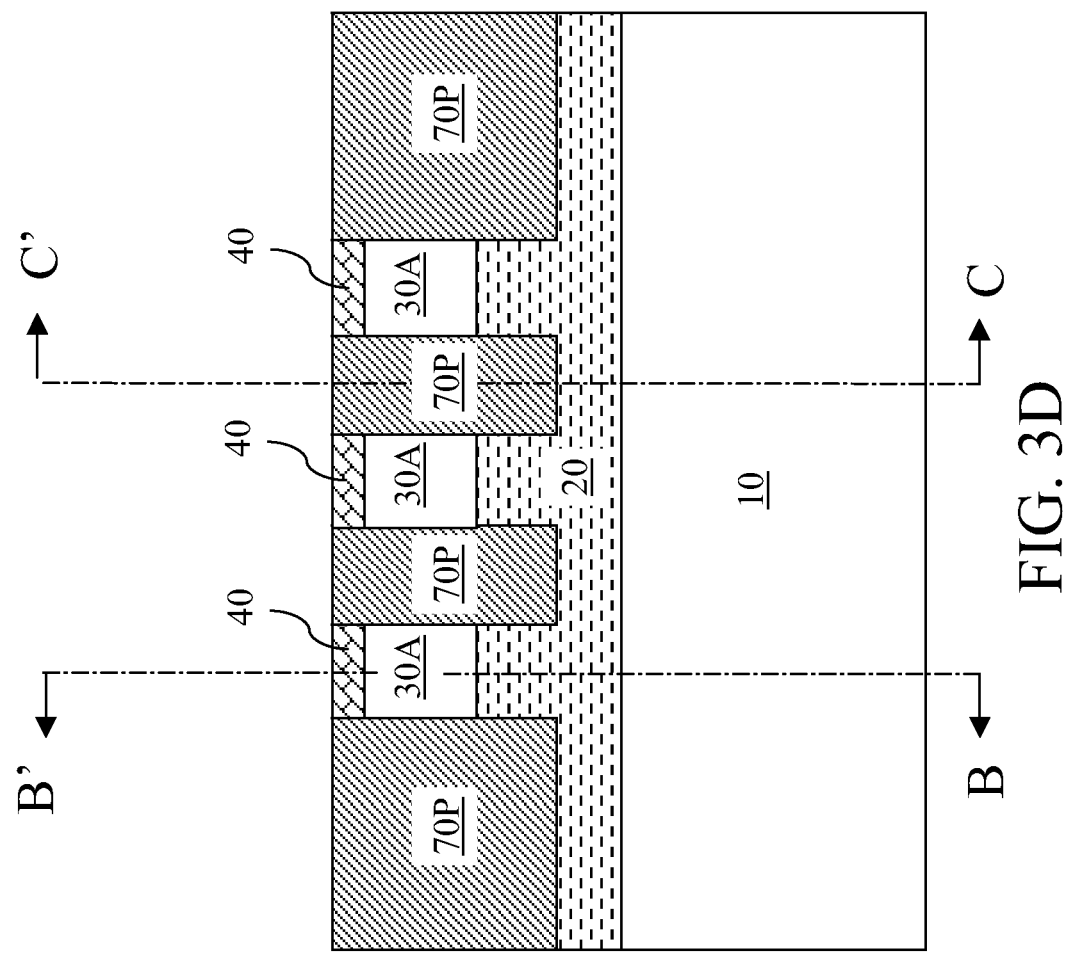
Figure 3E:
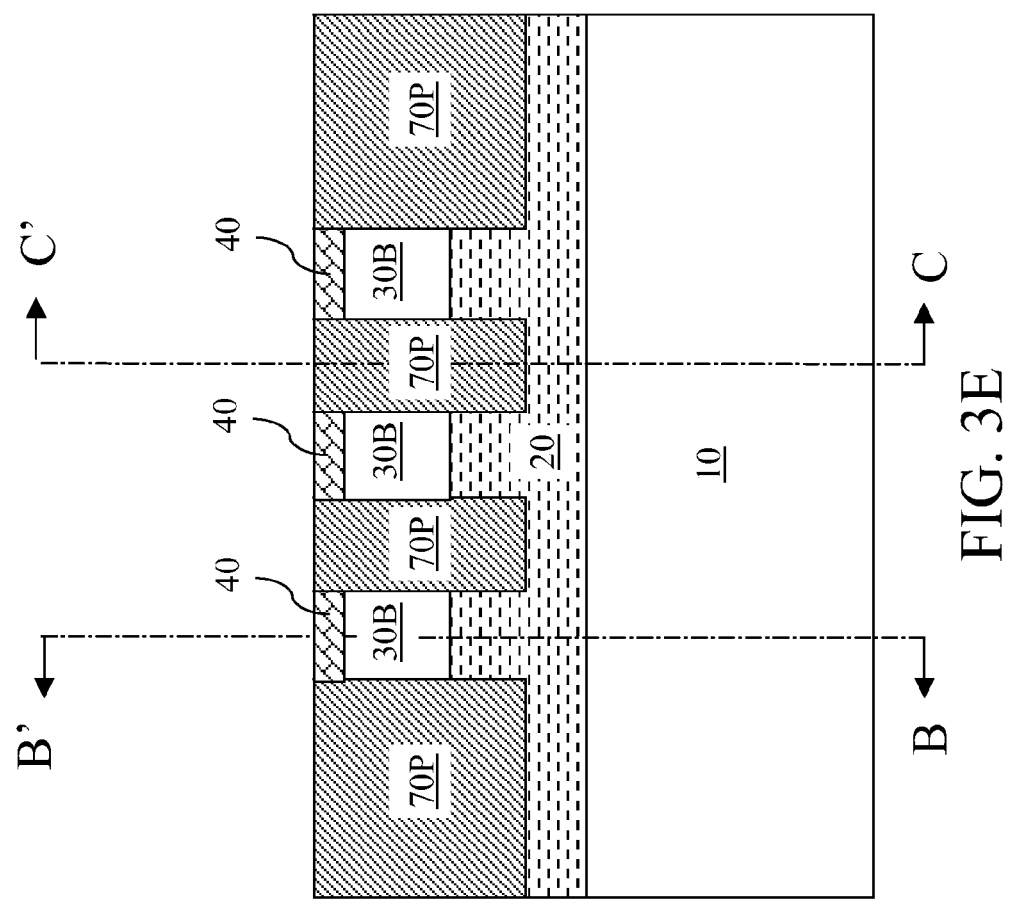
Figure 4A:
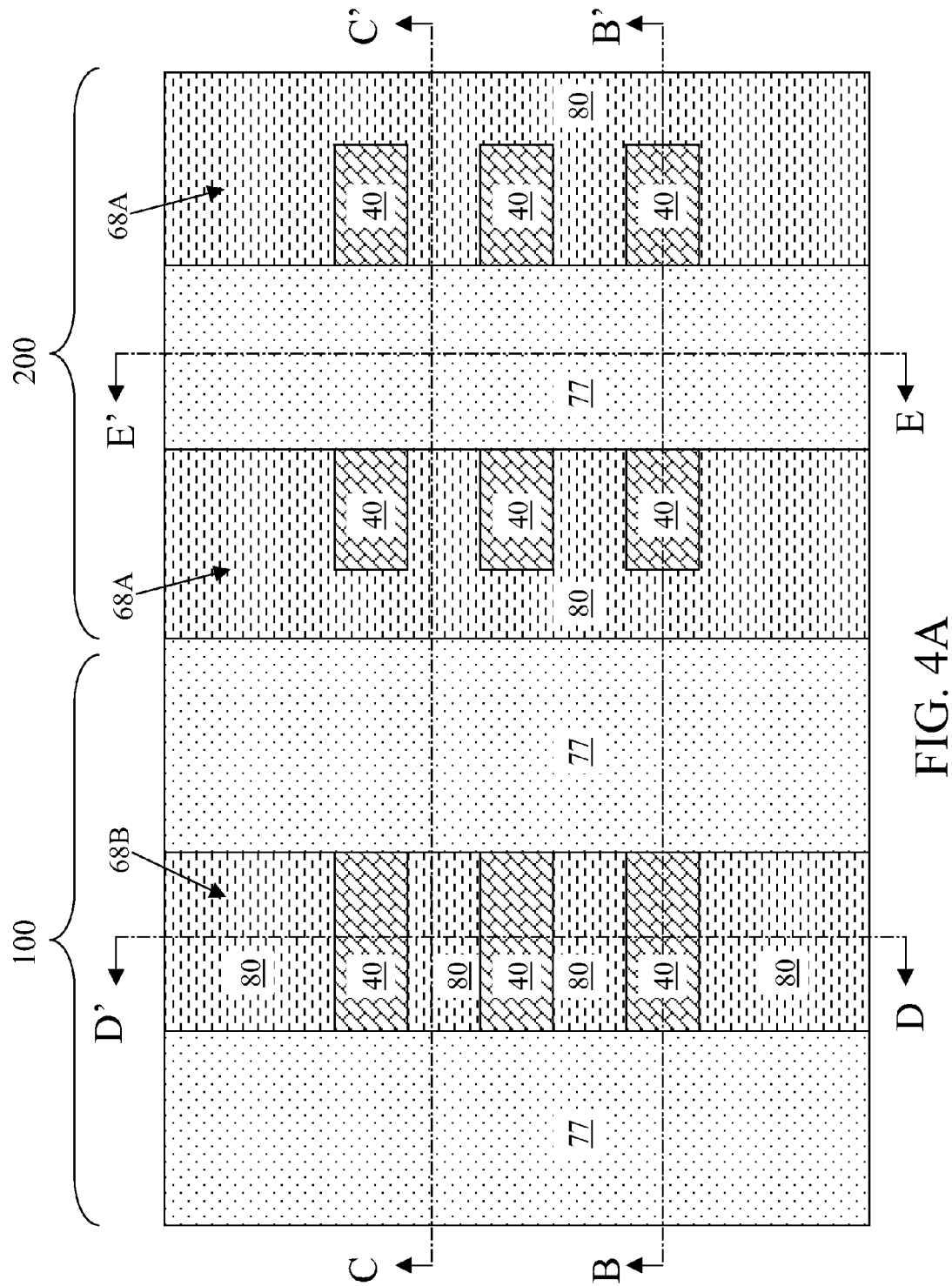
Figure 4B:
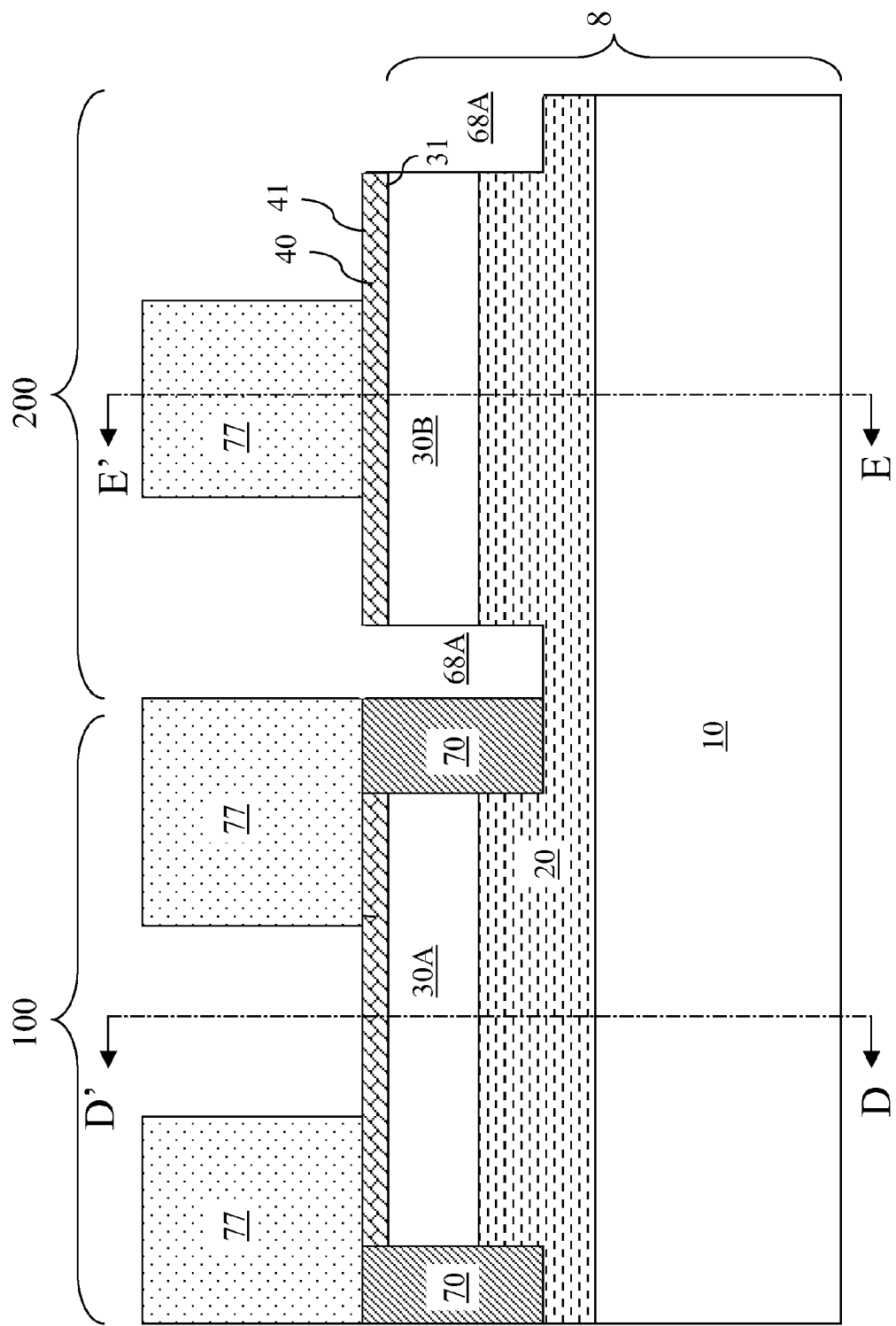
Figure 4C:
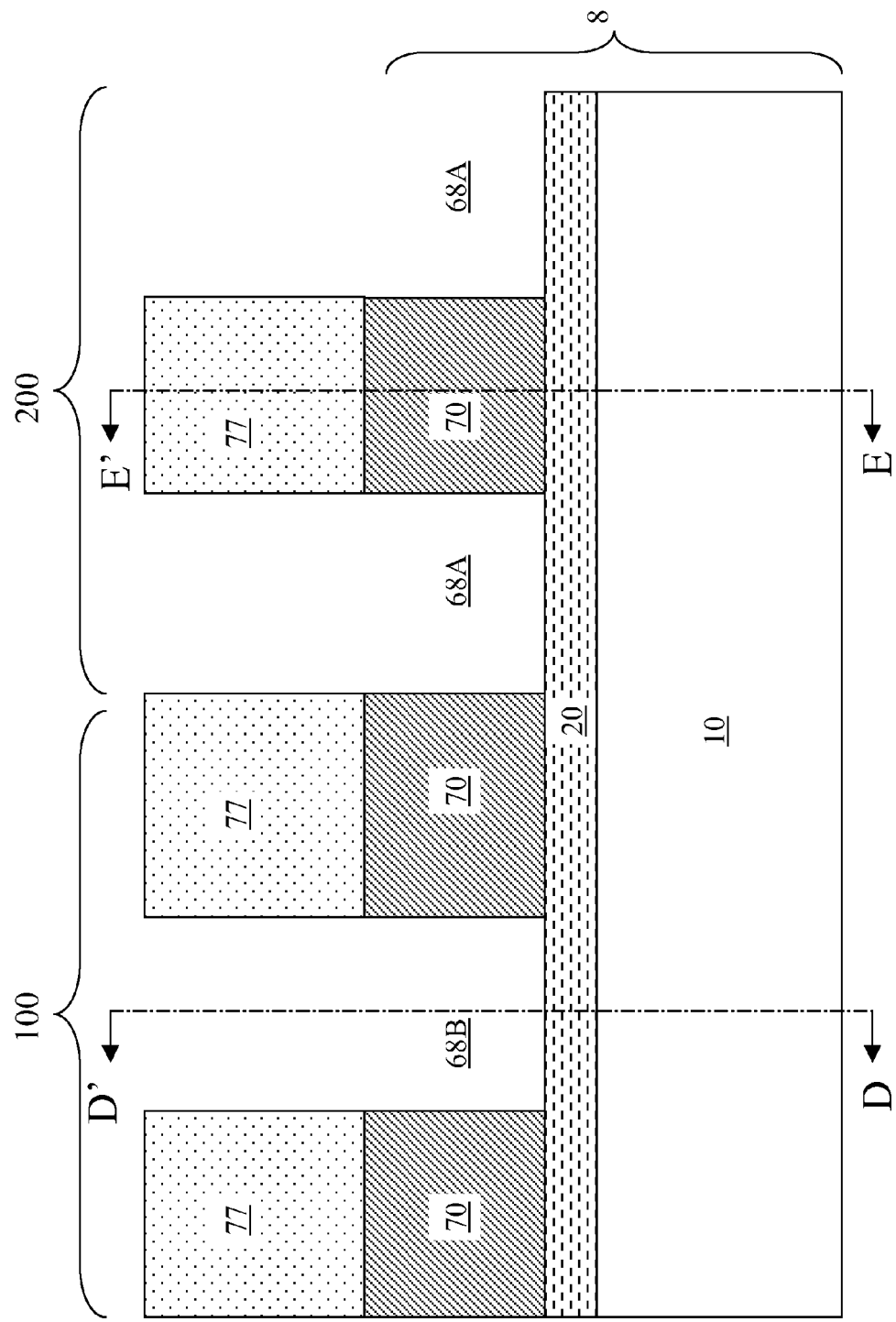
Figure 4D:
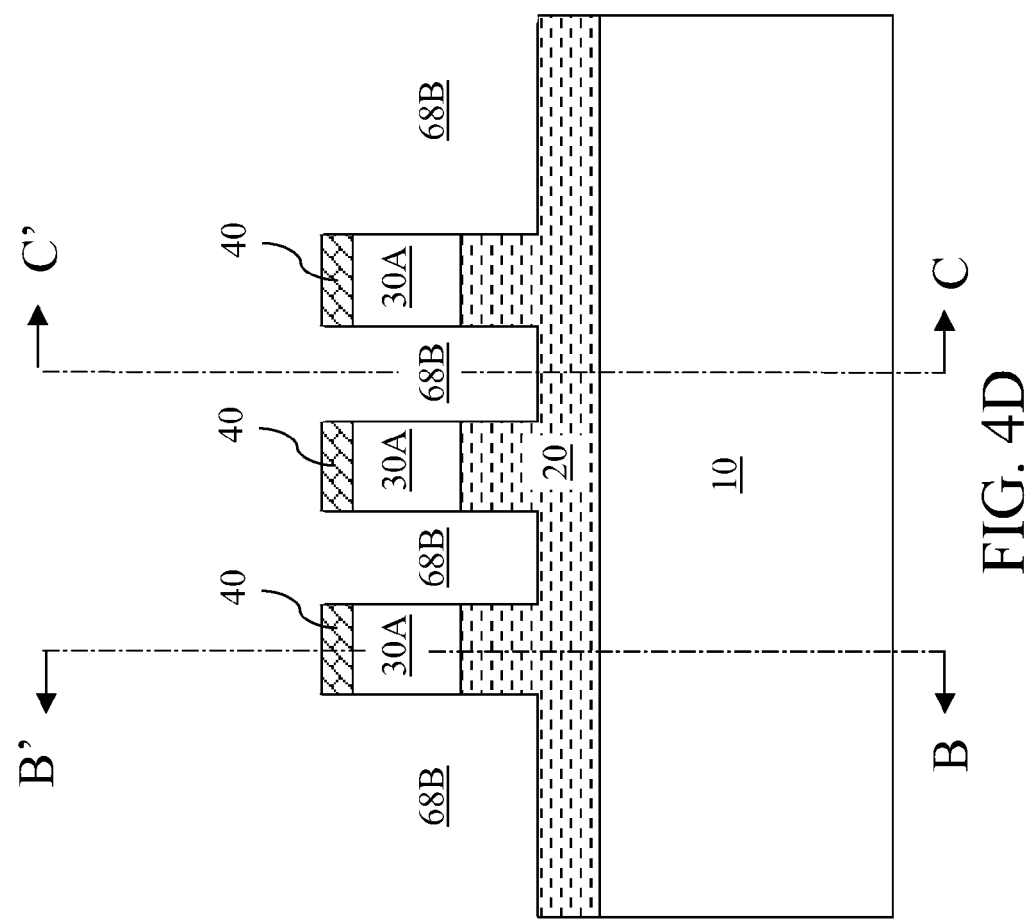
Figure 4E:
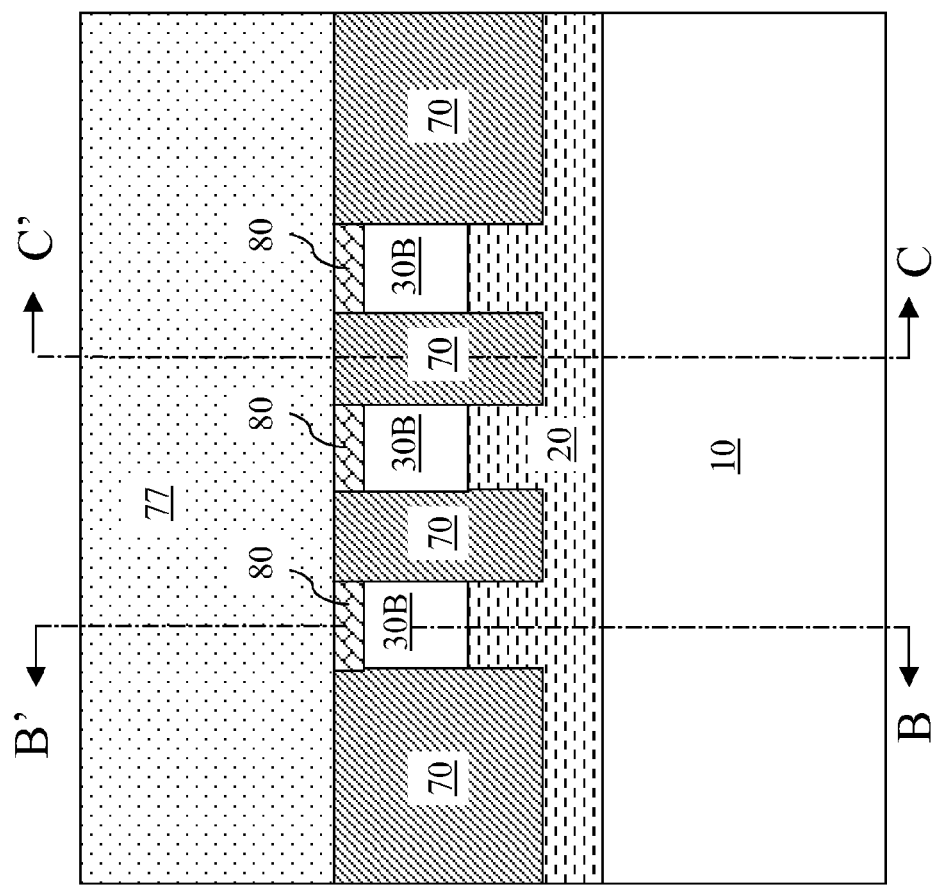
Figure 5A:
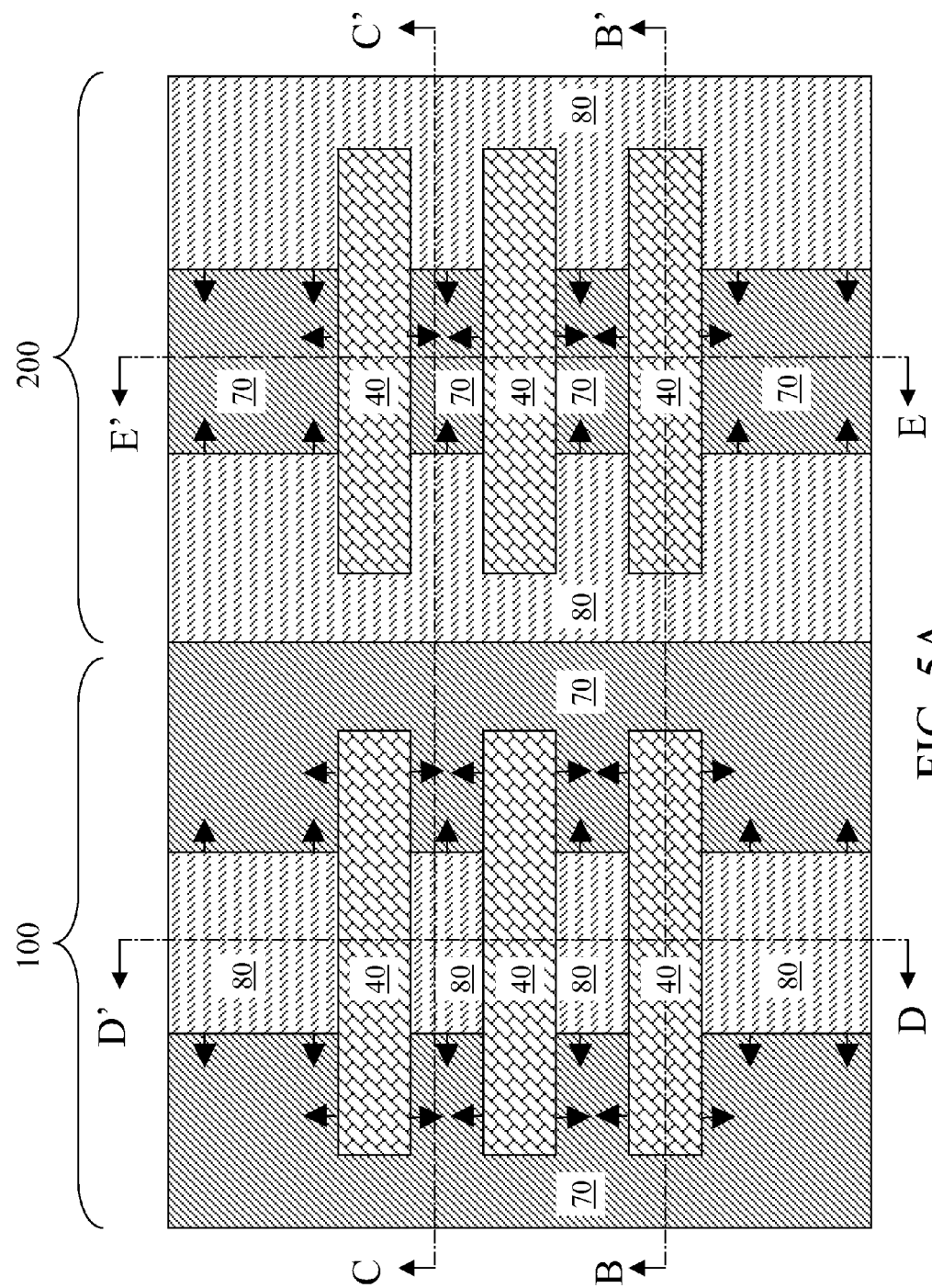
Figure 5B:
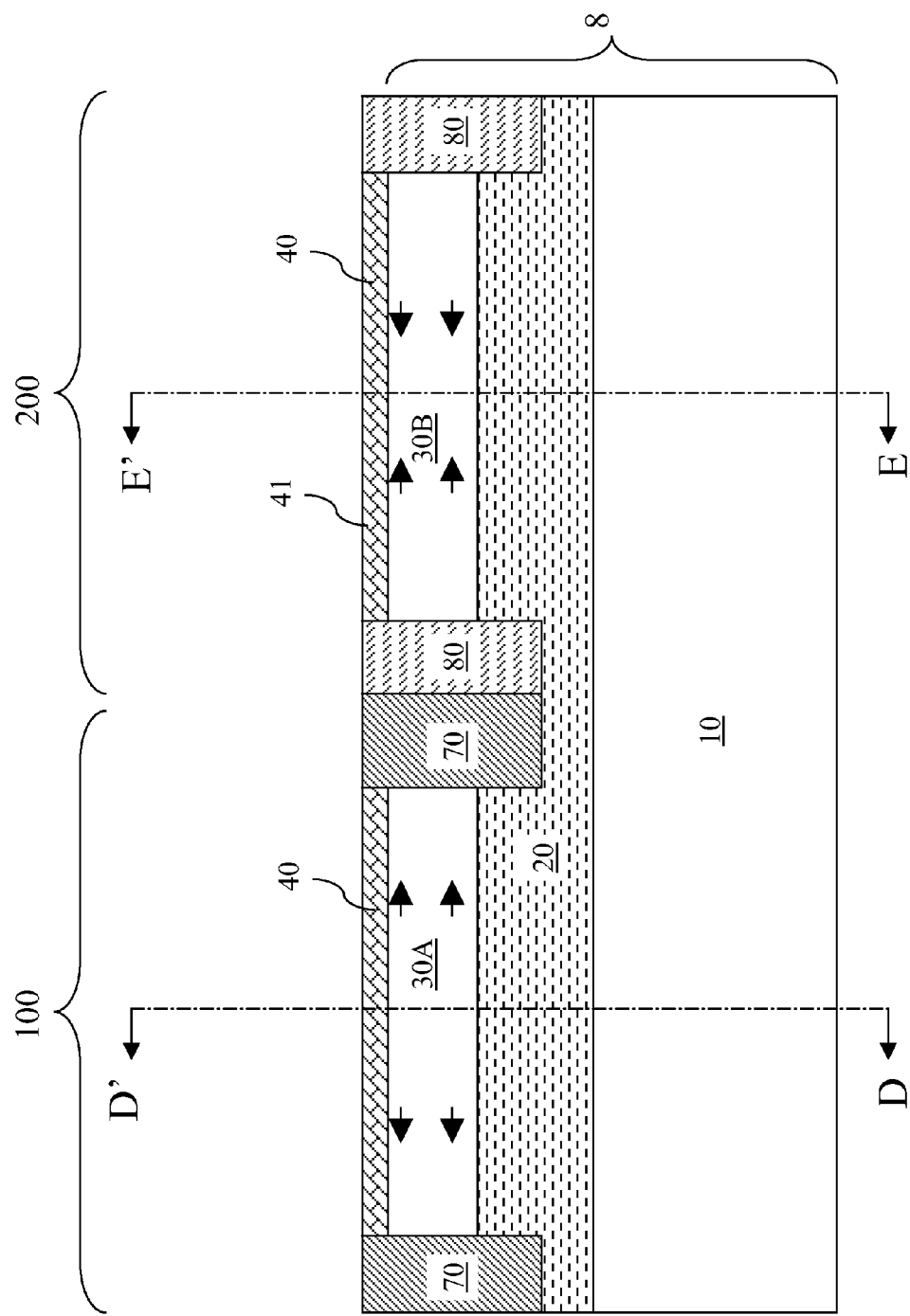
Figure 5C:
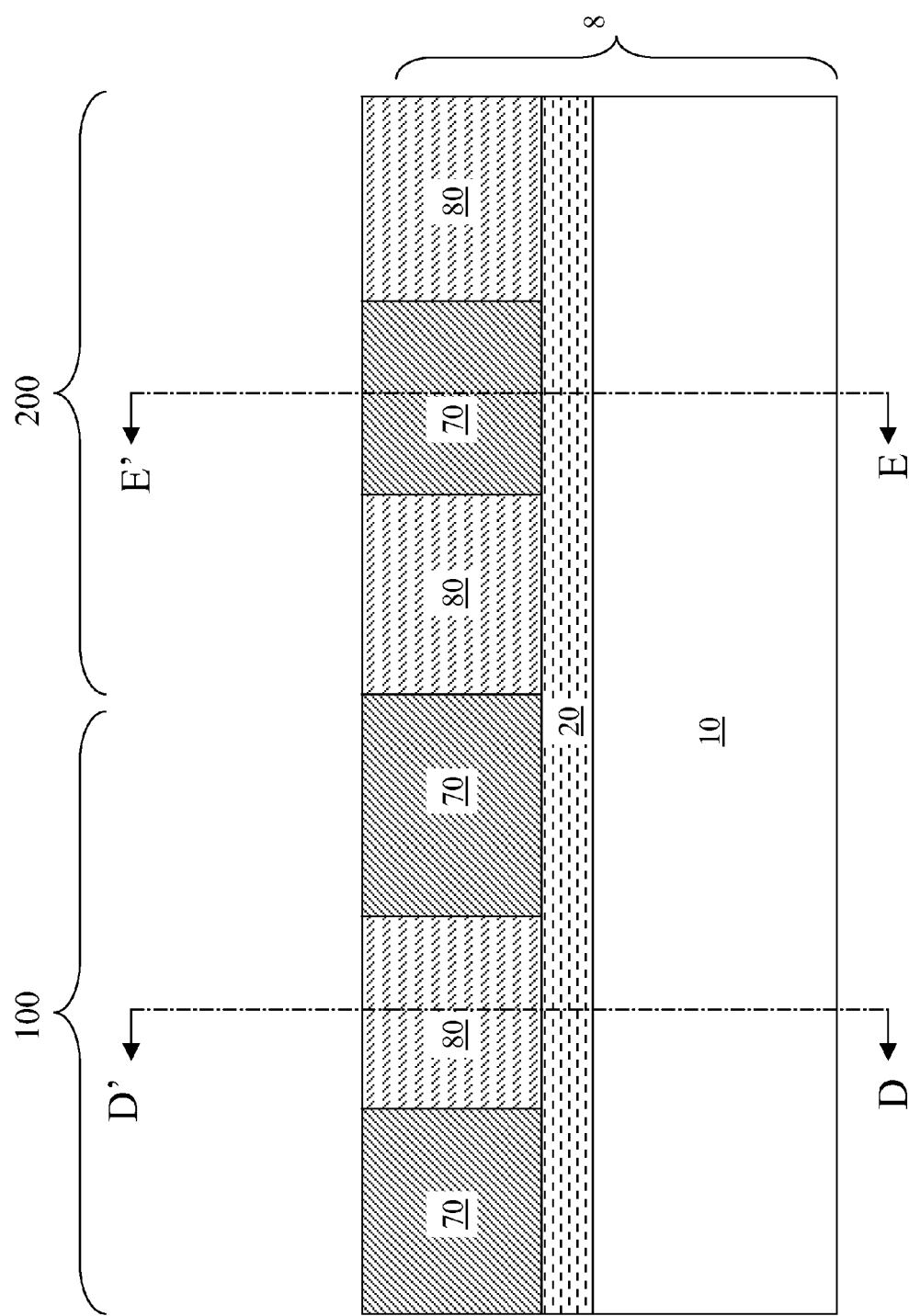
Figure 5D:
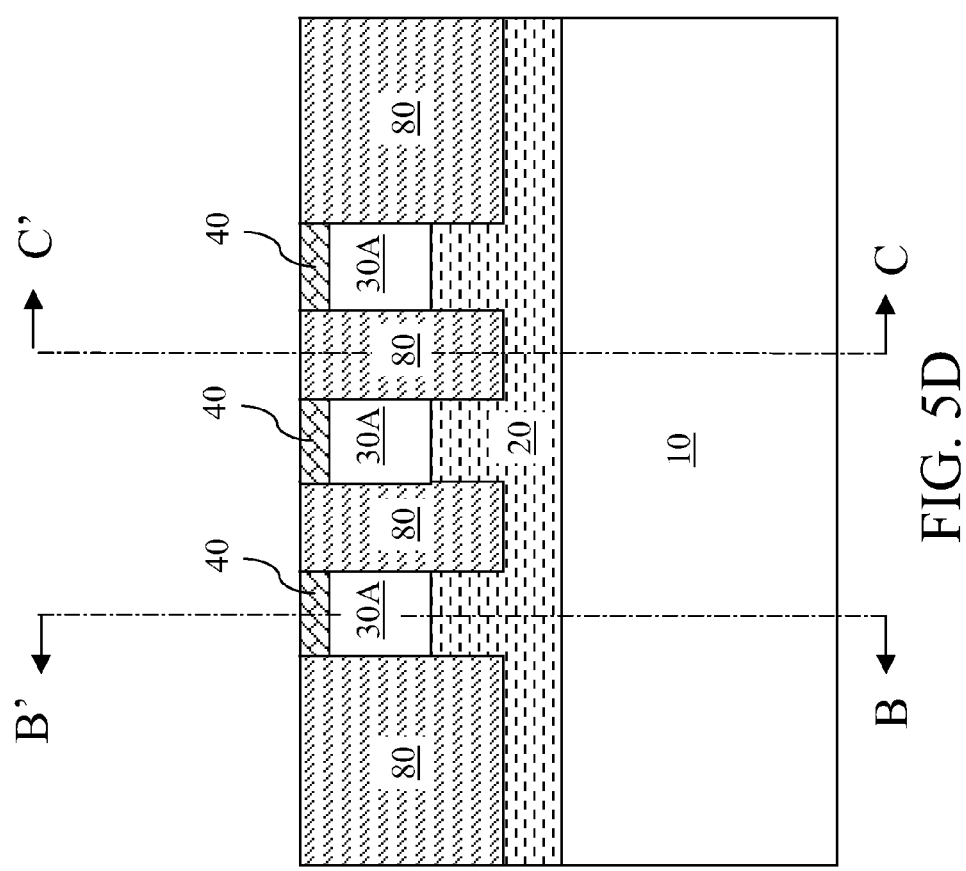
Figure 5E:
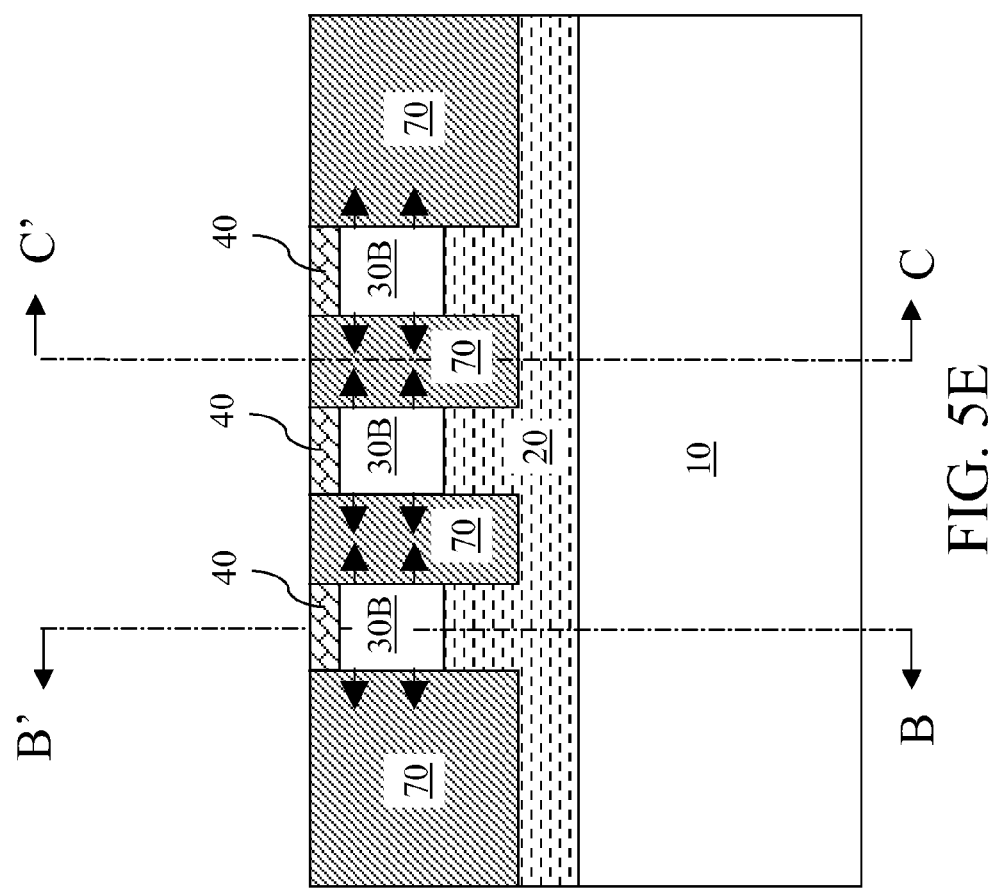
Figure 6A:
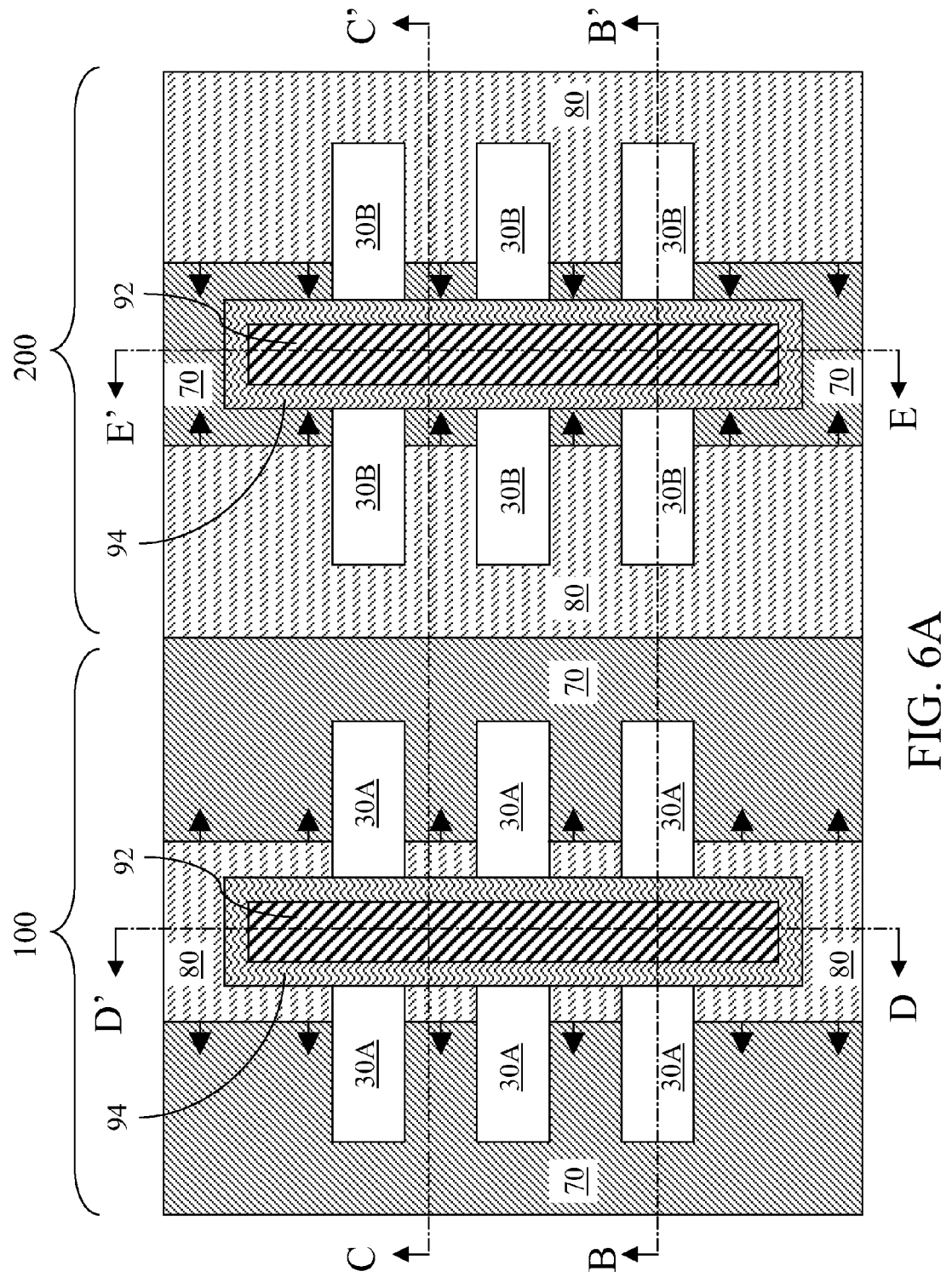
Figure 6B:
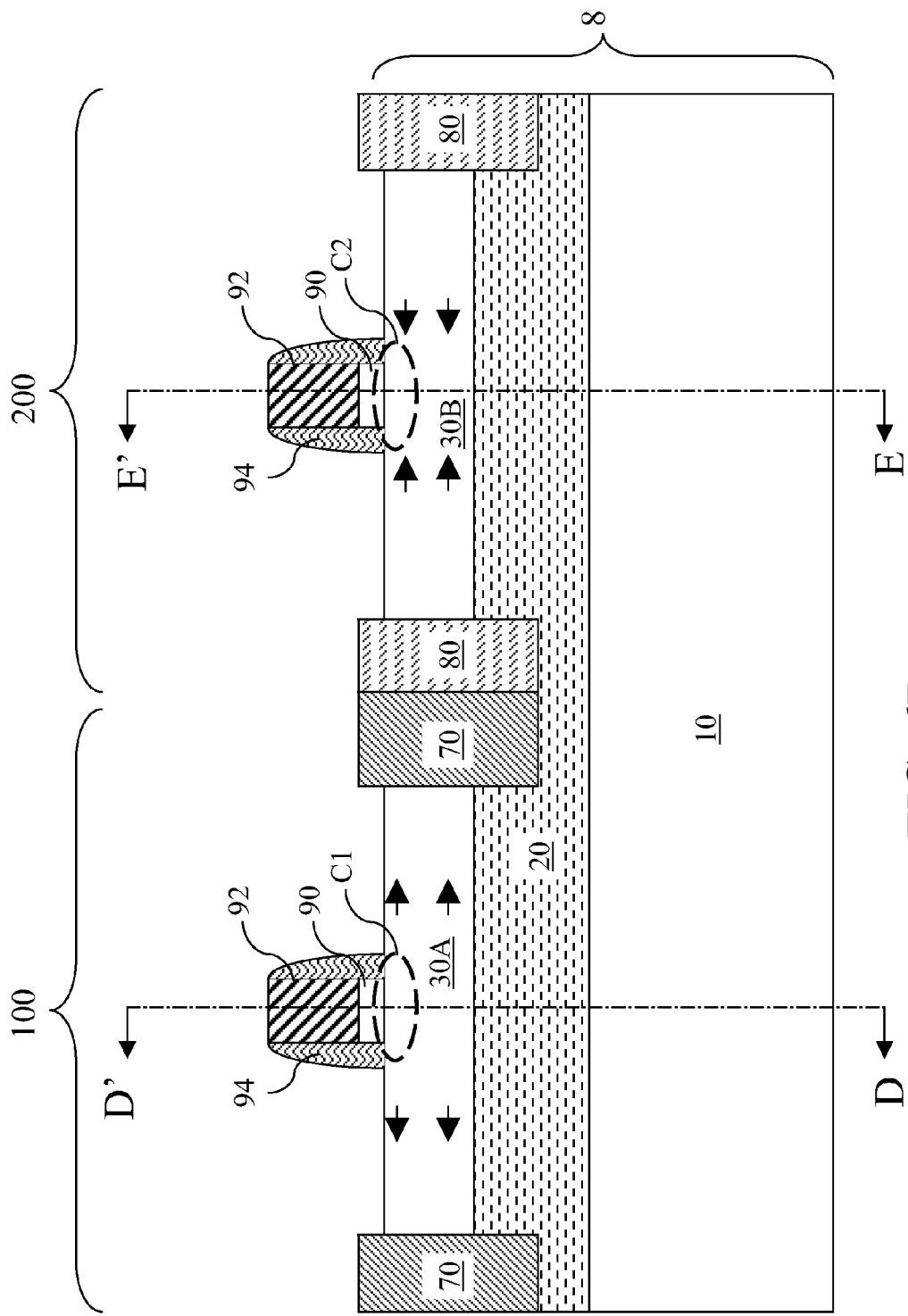
Figure 6C:
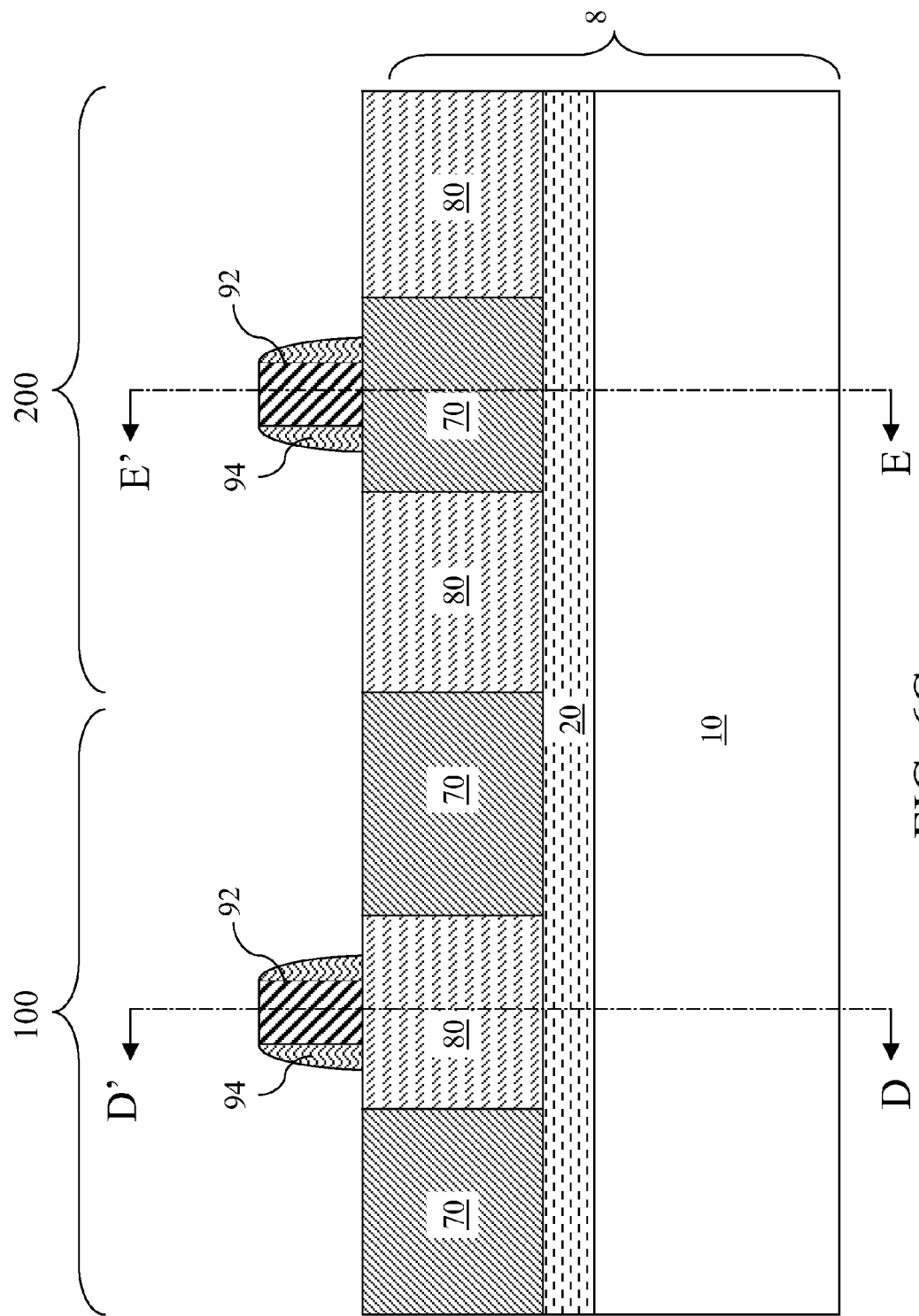
Figure 6D:
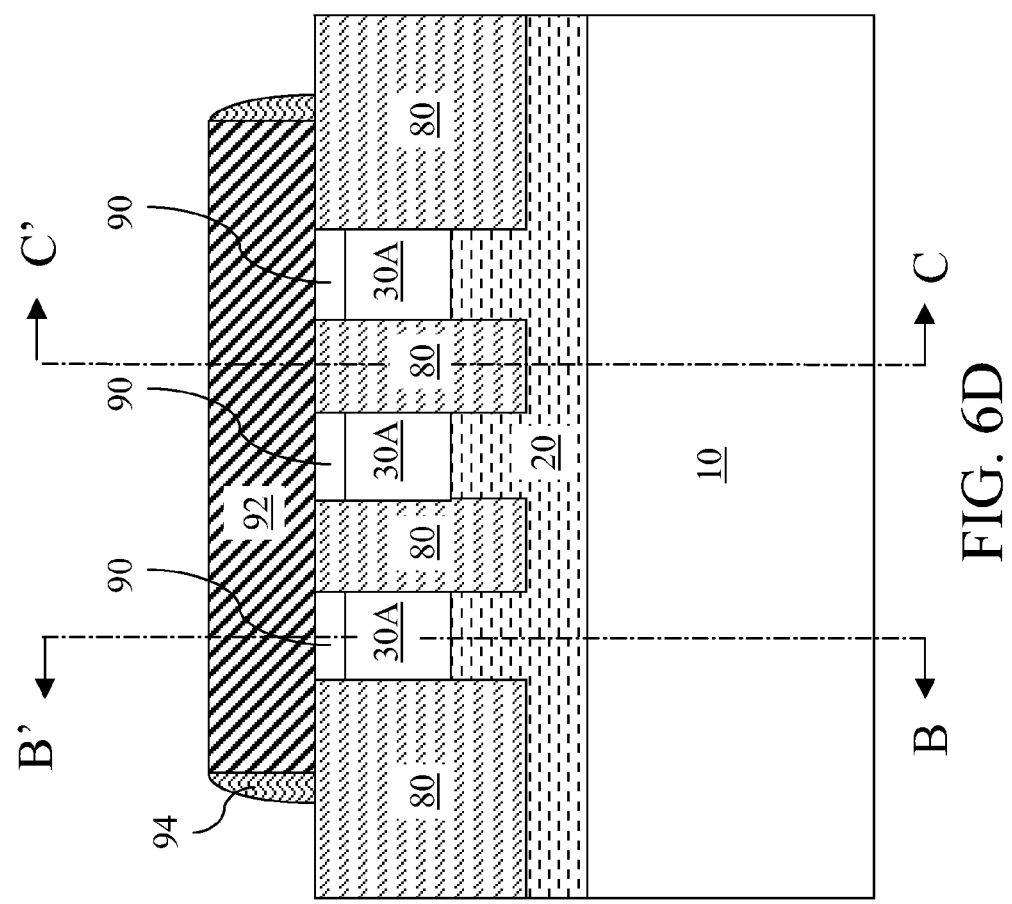
Figure 6E:
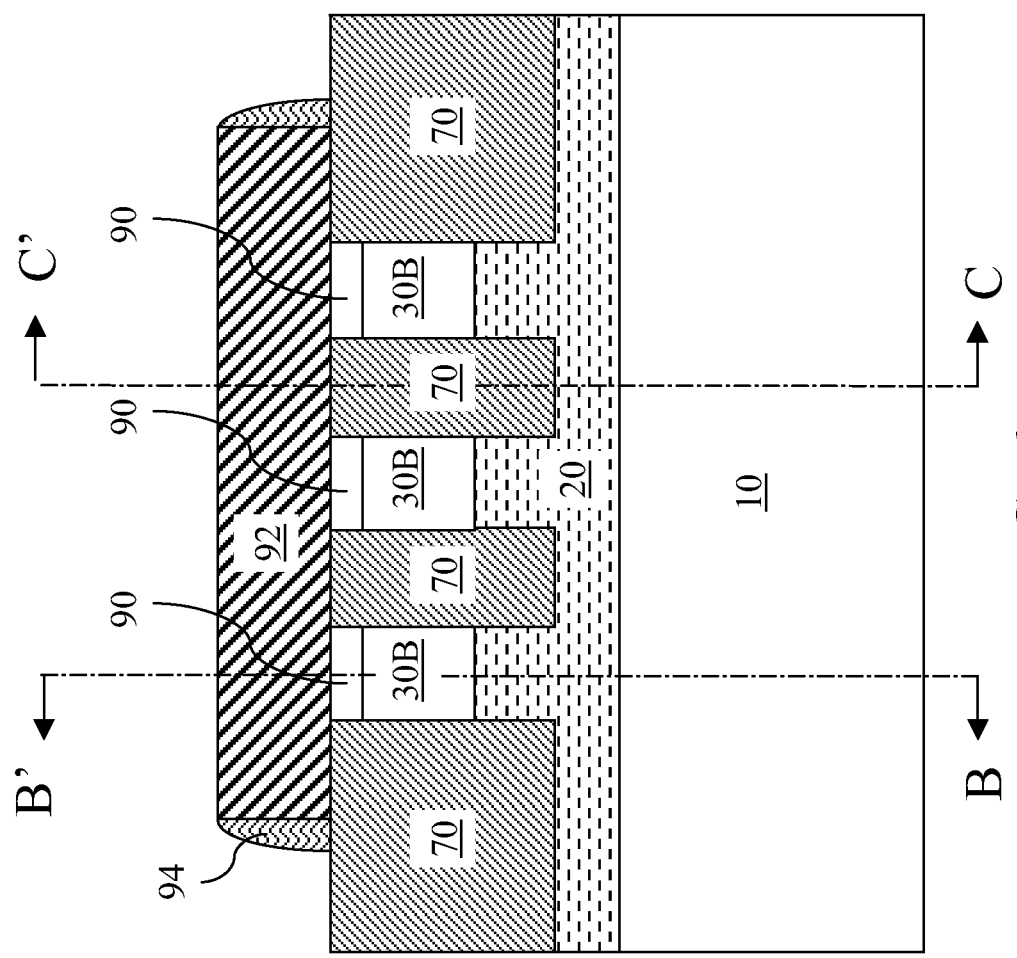
Figure 7A:
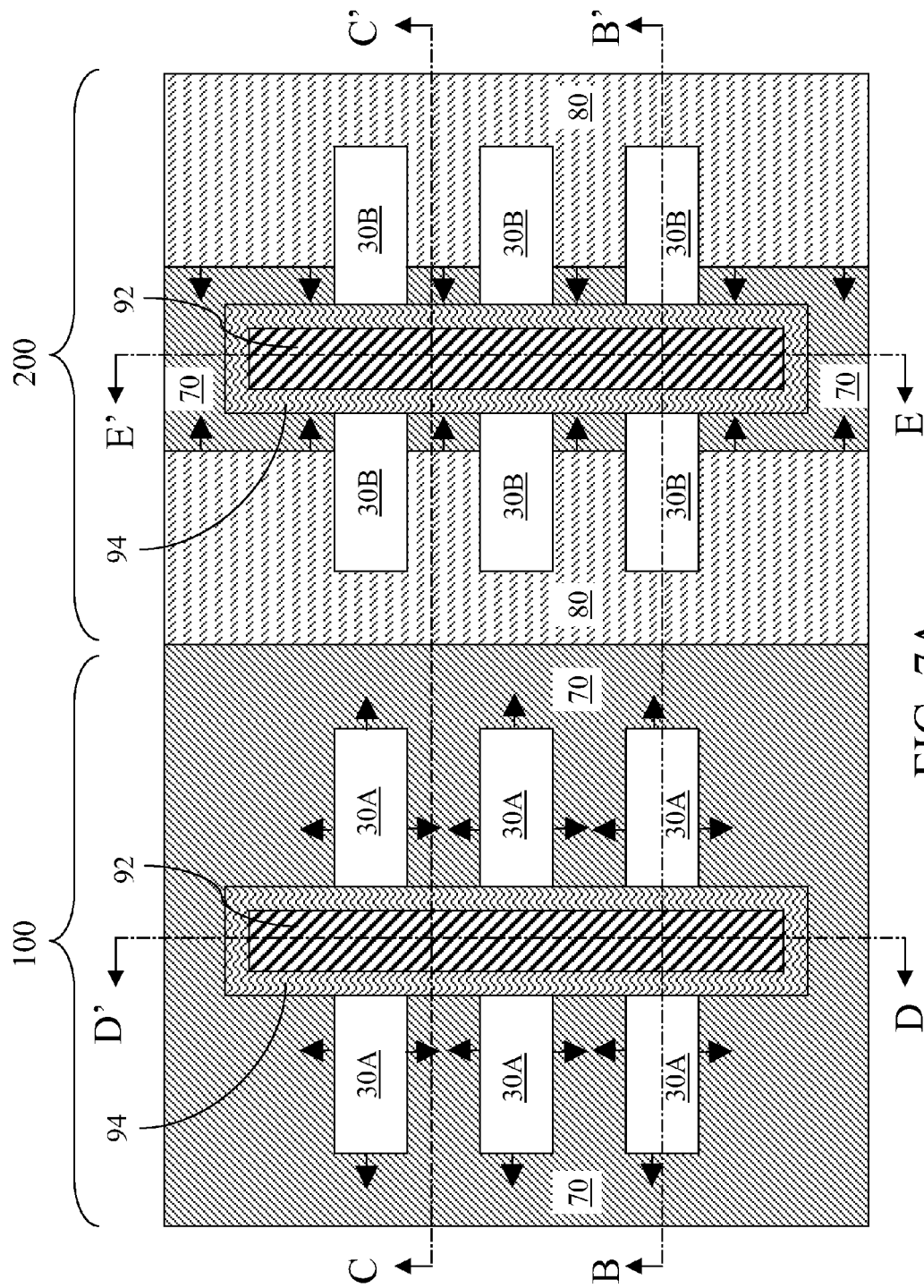
Figure 7B:
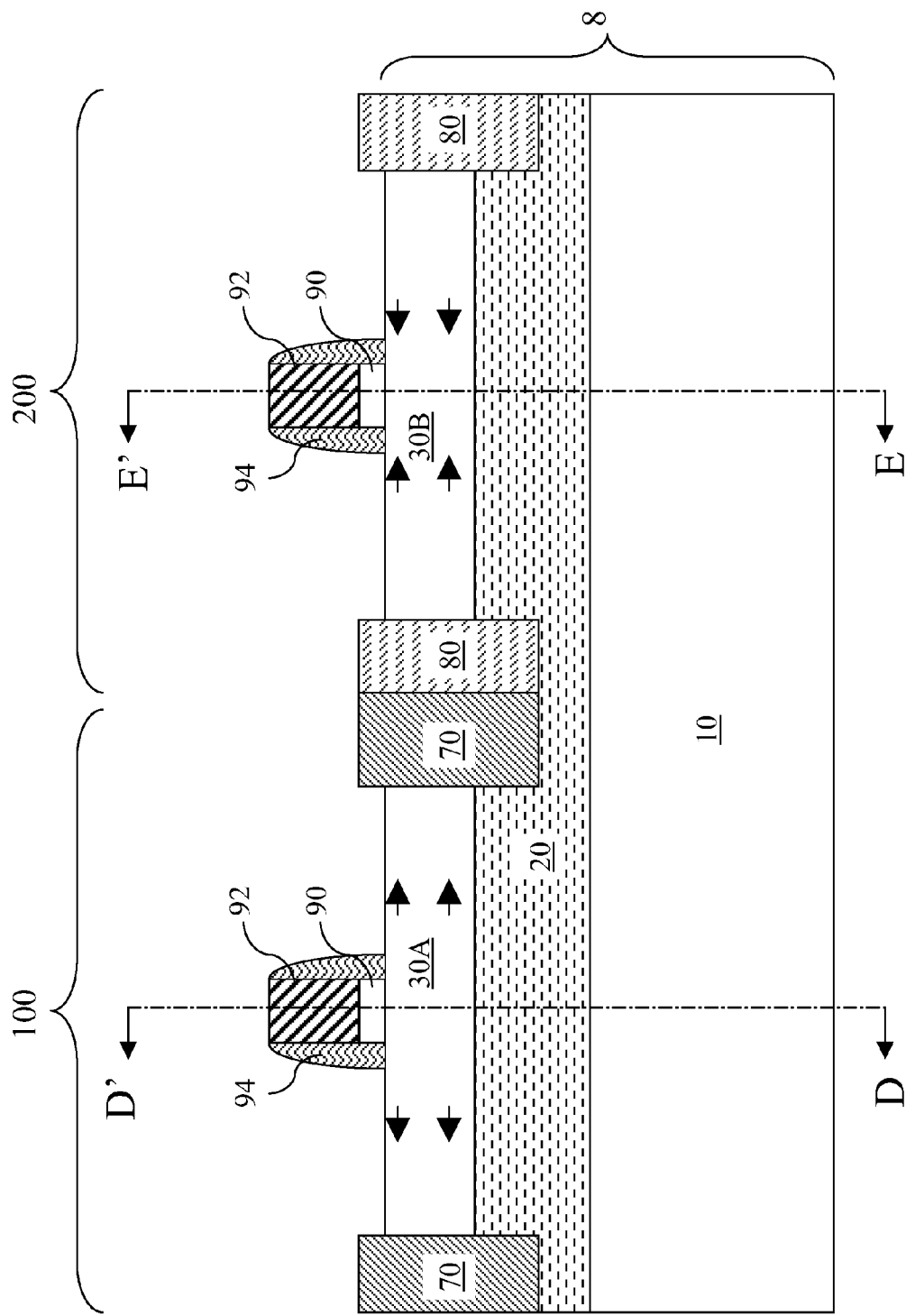
Figure 7C:
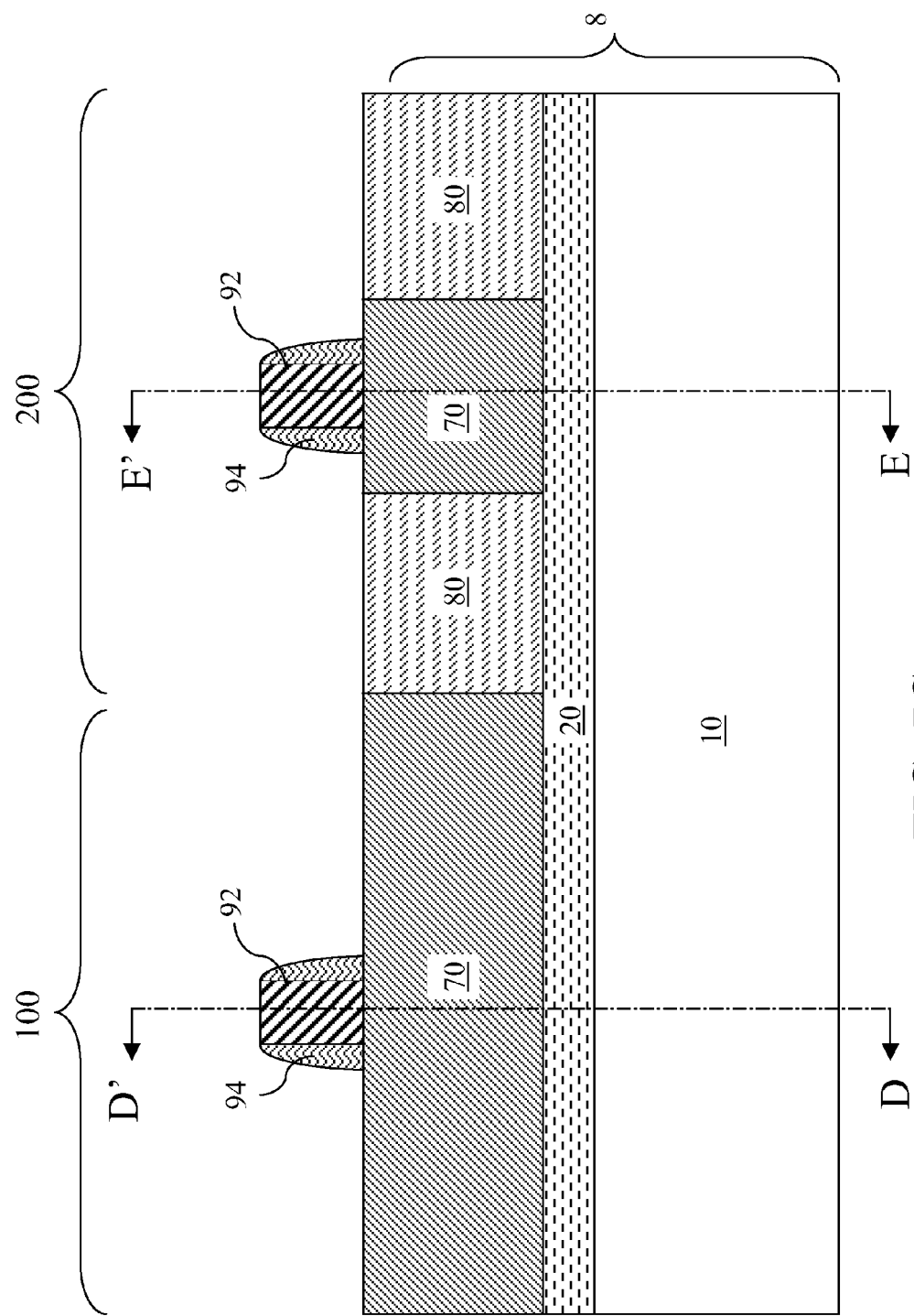
Figure 7D:
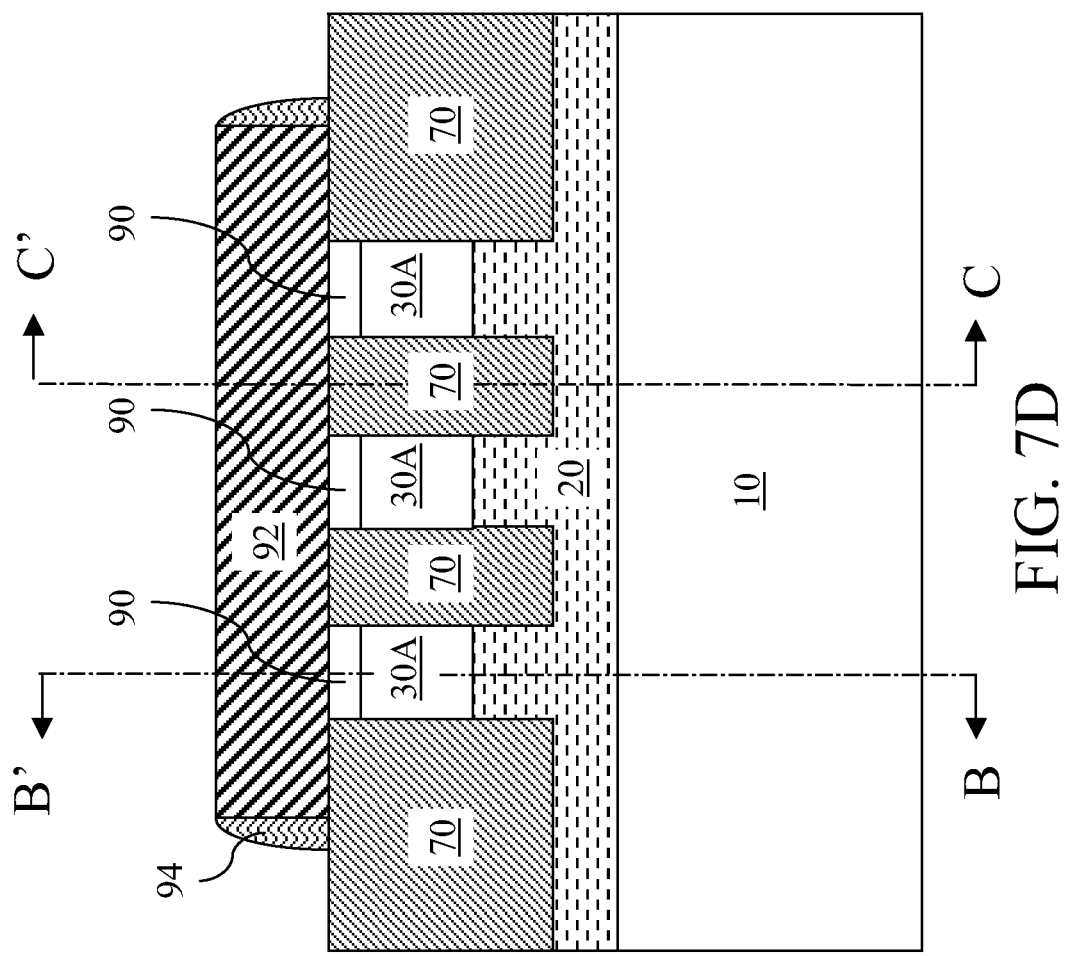
Figure 8A:
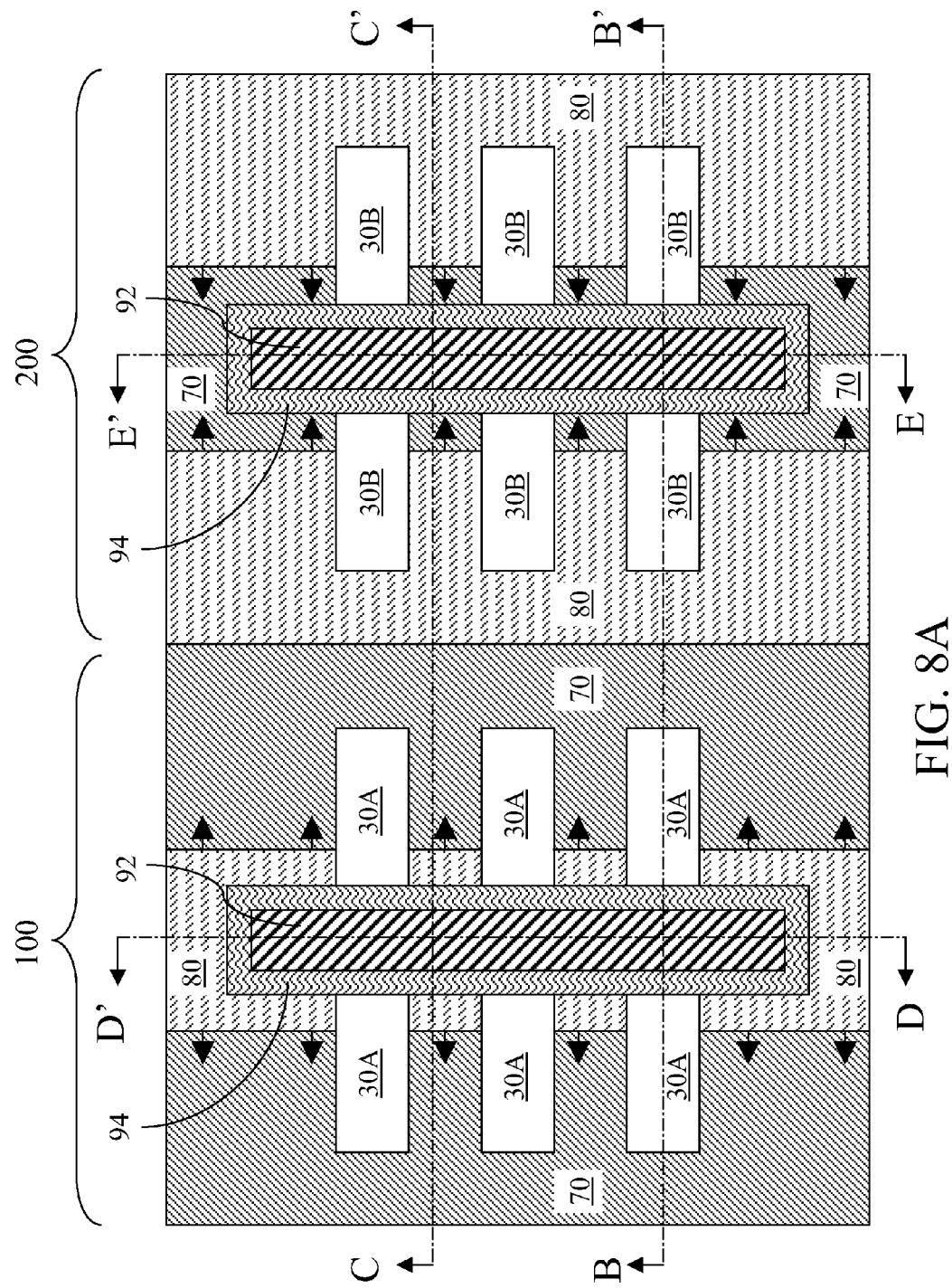
FIGS. 8A-8E are views of a second exemplary semiconductor structure according to a second embodiment of the present invention.
Figure 8B:
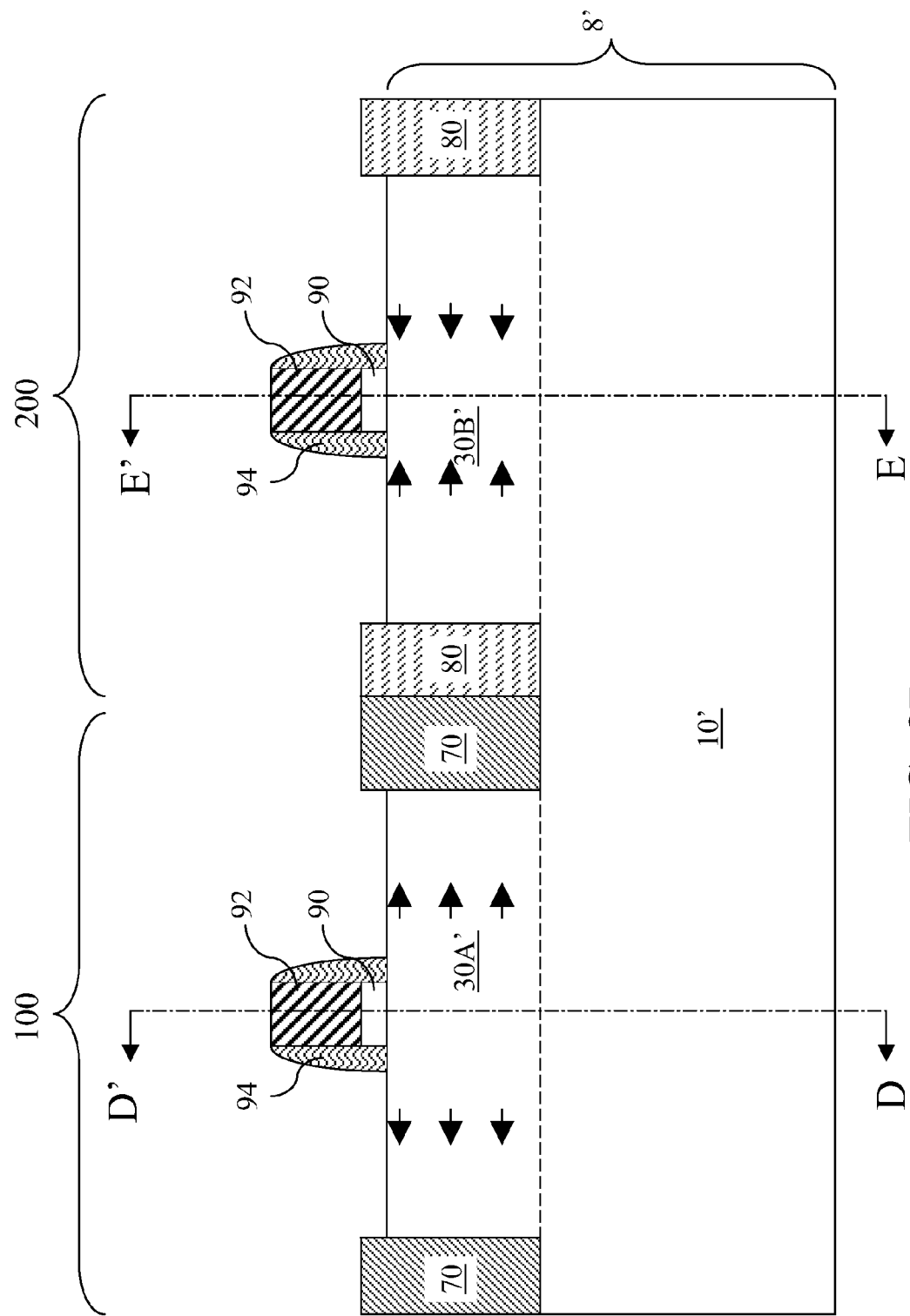
Figure 8C:
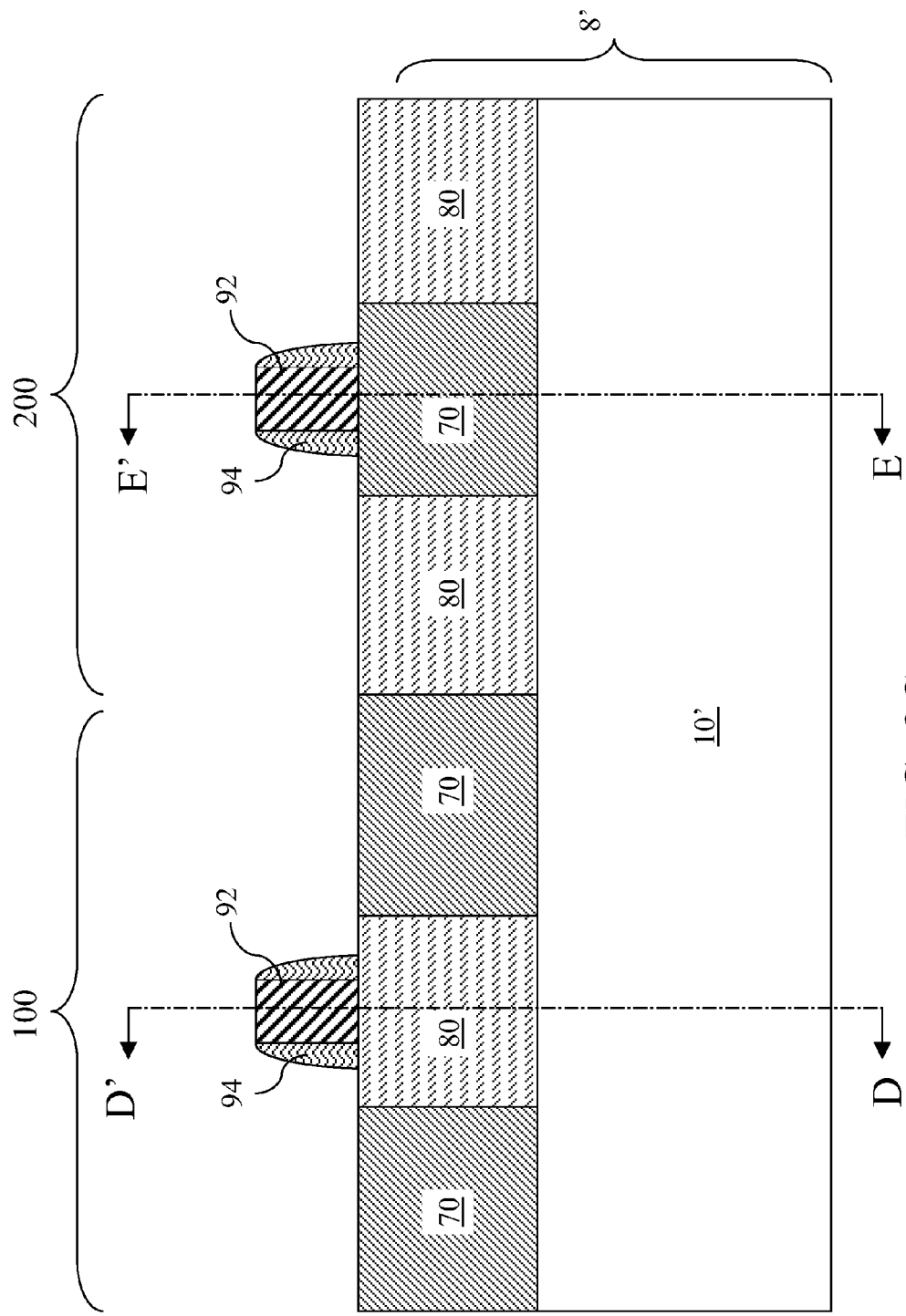
Figure 8D:
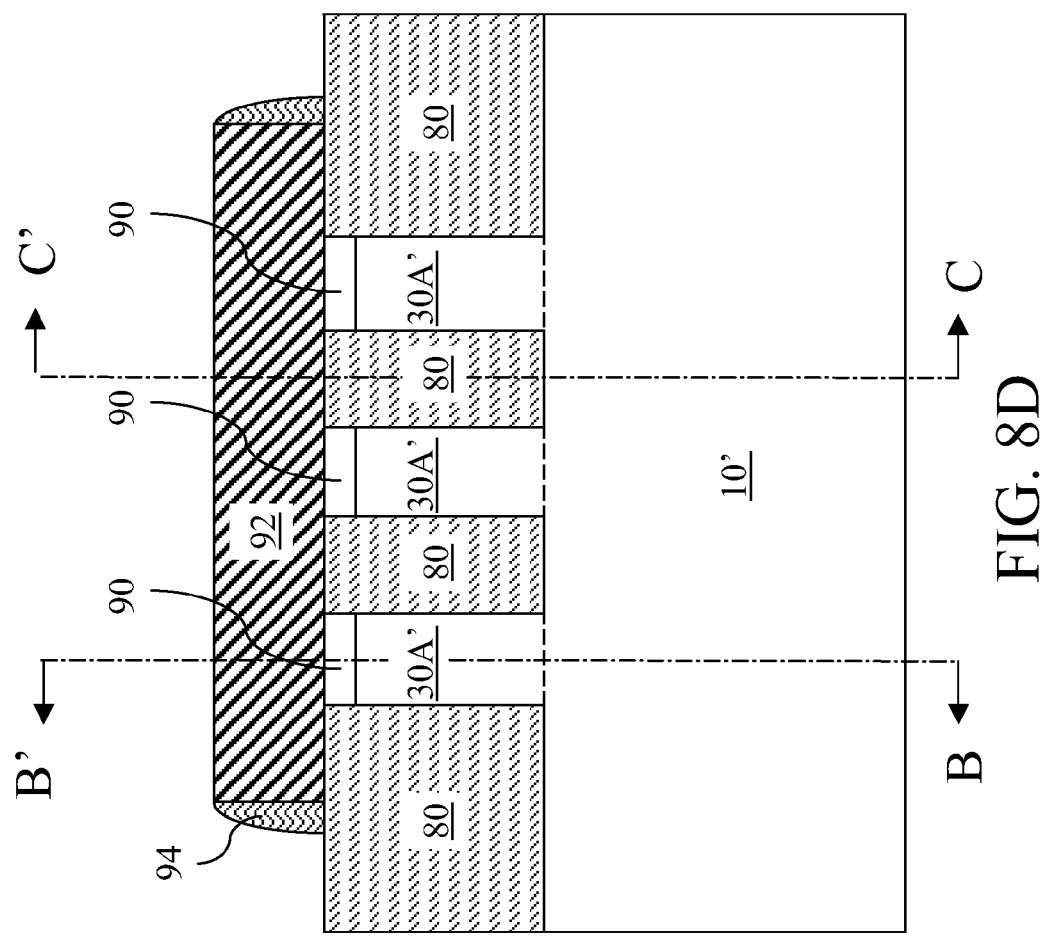
Figure 8E:
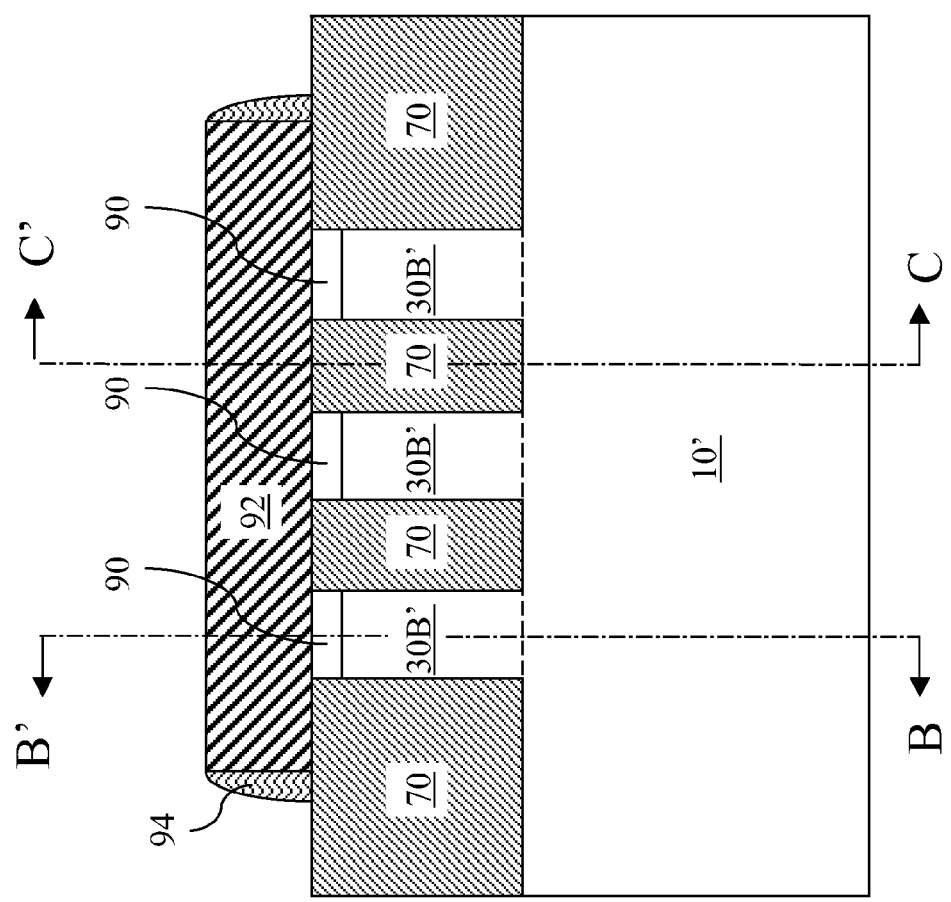

As stated above, the present invention relates to a stress-generating shallow trench isolation structure having a dual composition and methods of manufacturing the same, which are now described in detail with accompanying figures. It is noted that like and corresponding elements mentioned herein and illustrated in the drawings are referred to by like reference numerals.

Referring to FIG. 1, a first exemplary structure according to the present invention is shown, which comprises a semiconductor-on-insulator (SOI) substrate 8 and an etch stop layer 40 formed thereupon. The SOI substrate 8 containing a handle substrate 10, a buried insulator layer 20, and a top semiconductor layer 30. The handle substrate 10 comprises a semiconductor material such as silicon. Preferably, the handle substrate 10 comprises a single crystalline semiconductor material. The handle substrate 10 may be undoped or have a p-type doping or an n-type doping. The handle substrate 10 may be doped at a dopant concentration from about $1.0\times10^{15}/cm^3$ to about $3.0\times10^{17}/cm^3$. The buried insulator layer 20 comprises a dielectric material such as silicon oxide or silicon nitride. For example, the buried insulator layer 20 may comprise thermal silicon oxide. The thickness of the buried insulator layer 20 may be from about 20 nm to about 500 nm, and typically from about 100 nm to about 200 nm.

The top semiconductor layer 30 comprises a semiconductor material. The thickness of the top semiconductor layer 30 may be from about 5 nm to about 300 nm, and preferably from about 20 nm to about 100 nm. Preferably, the top semiconductor layer 30 comprises a single crystalline semiconductor material. The semiconductor material of the top semiconductor layer 30 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material of the top semiconductor layer 30 comprises single crystalline silicon.

An etch stop layer 40 is formed on the SOT substrate 8, for example by chemical vapor deposition. The etch stop layer 40 comprises a material that has etch selectivity relative to a first shallow trench isolation material to be subsequently employed. The etch stop layer 40 may comprise a silicon germanium alloy or a silicate glass such as undoped silicate glass (USG), borosilicate glass (BSG), phosphosilicate glass (PSG), fluorosilicate glass (FSG), borophosphosilicate glass (BPSG). Alternately, the etch stop layer 40 may comprise a high-k material containing a metal and oxygen, known in the art as high-k gate dielectric materials. In this case, the etch stop layer 40 may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Non-stoichiometric variants are also contemplated herein. Yet alternately, the etch stop layer 40 may comprise a dielectric nitride such as TaN, TiN, and WN. The thickness of the etch stop layer 40 depends on the composition of the etch stop layer 40, the composition of the first shallow trench isolation material, and the thickness of a shallow trench to be subsequently formed. For example, the thickness of the etch stop layer may be from about 10 nm to about 200 nm, and preferably from about 10 nm to about 100 nm, and more preferably from about 10 nm to about 50 nm.

Referring to FIGS. 2A-2D, a first photoresist 47 is applied over the etch stop layer 40 and lithographically patterned. The pattern in the first photoresist 47 is transferred into the etch stop layer 40, the top semiconductor layer 30, and the buried insulator layer 20. A first group of remaining portions of the top semiconductor layer 30 within a first device region 100 constitutes at least one first active area 30A. A second group of the remaining portions of the top semiconductor layer 30 within a second device region 200 constitutes at least one second active area 30B. The volume from which portions of the etch stop layer 40, portions of the top semiconductor layer 30, and portions of the buried insulator layer 20 are removed constitutes a shallow trench 67. The bottom surface of the shallow trench 67 is located between a top surface of the buried insulator layer 20 and a bottom surface of the buried insulator layer, which is an interface between the buried insulator layer 20 and the handle substrate 10.

Each of the at least one first active area 30A and the at least one second active area 30B may have a polygonal or elliptical horizontal cross-sectional area. In case one of the active areas (30A, 30B) has a polygonal horizontal cross-sectional area, a pair of lengthwise sidewalls and a pair of widthwise sidewalls may be present in the active area. Preferably, each of the at least one first active area 30A and the at least one second active area 30B has a rectangular cross-sectional area. In this case, the lengthwise direction is the direction of a set of longer sidewalls and the widthwise direction is the direction of a set of shorter sidewalls. In general, the lengthwise direction refers to the direction of a set of longest sidewalls, and the widthwise direction refers to the horizontal direction that is perpendicular to the lengthwise direction.

For the purposes of the present invention, rectangular cross-sectional areas are assumed for each of the at least one first active area 30A and the at least one second active area 30B. Embodiments in which the sidewalls are curved and/or the cross-sectional areas contain a polygon that is not a rectangle are also explicitly contemplated herein.

Each of the at least one first active area 30A and the at least one second active area 30B contain a pair of lengthwise sidewalls and a pair of widthwise sidewalls. Each lengthwise sidewall may be directly adjoined to two widthwise sidewalls, and each widthwise sidewall may be directly adjoined to two lengthwise sidewalls. Each of the at least one first active area 30A and the at least one second active area 30B contains a top semiconductor surface 31, which is also an interface between the etch stop layer 40 and one of the at least one first active area 30A and the at least one second active area 30B. The shallow trench 67 comprises the cavity below an etch stop layer top surface 41, which is a top surface of the etch stop layer 40.

Referring to FIGS. 3A-3E, the first photoresist 47 is removed, for example, by ashing. The first exemplary semiconductor structure may be cleaned, for example, by a wet clean. A first shallow trench isolation material is deposited into the shallow trench 67, and is then planarized.

The first shallow trench isolation material may be a stress-generating material or a non-stress-generating material that does not apply a substantial amount of stress to surrounding regions including the at least one first active area 30A and the at least one second active area 30B. The measure of stress, as described in the present invention, is the impact on mobility of charge carriers, which are holes or electrons, in the at least one first active area 30A or the at least one second active area 30B. Thus, a stress-generating material applies a sufficient level of stress to the at least one first active area 30A or the at least one second active area 30B to alter the charge carrier mobility therein. A non-stress-generating material does not generate a stress that materially alters charge carrier mobility in the at least one first active area 30A or the at least one second active area 30B.

The first shallow trench isolation material is a dielectric material. The first shallow trench isolation material may be deposited, for example, by low pressure chemical vapor deposition (LPCVD), high density plasma chemical vapor deposition (HDPCVD), plasma enhanced chemical vapor deposition (PECVD), or other deposition methods for dielectric materials.

In case the first shallow trench isolation material comprises a stress-generating material, the first shallow trench isolation material may apply a compressive stress or a tensile stress to surrounding regions, i.e., may be a compressive-stress-generating material or a tensile-stress-generating material. An exemplary compressive-stress-generating material is a compressive-stress-generating silicon nitride. An exemplary tensile stress-generating material is a tensile stress-generating silicon nitride. Methods of forming the compressive-stress-generating silicon nitride or the tensile-stress-generating silicon nitride are known in the art.

In case the first shallow trench isolation material comprises a non-stress-generating material, the first shallow trench isolation material does not apply a substantial level of stress to surrounding regions. For the purposes of the present invention, materials having an intrinsic stress less than 100 MPa are considered to be non-stress-generating. Exemplary non-stress-generating materials include, but are not limited to, undoped silicate glass (USG), borosilicate glass (BSG), phosphosilicate glass (PSG), fluorosilicate glass (FSG), and borophosphosilicate glass (BPSG).

The first shallow trench isolation material is then planarized by chemical mechanical polishing (CMP), a recess etch, or a combination thereof. When chemical mechanical planarization is employed, the etch stop layer 40 may be used as a stopping layer. When a recess etch is employed, the etch stop layer 40 may be use as an endpoint layer so that the recess etch may stop upon detection of exposure of the etch stop layer 40. At the end of planarization, the first shallow trench isolation material filling the shallow trench 67 constitutes a prototype shallow trench isolation structure 70P, which is contiguous throughout the first exemplary semiconductor structure at this point. Preferably, a top surface of the prototype shallow trench isolation structure 70P is coplanar with the etch stop layer top surface 41, which is the top surface of the etch stop layer 40.

Referring to FIGS. 4A-4E, a second photoresist 77 is applied over the etch stop layer 40 and the prototype shallow trench isolation structure 70P. The second photoresist is lithographically patterned to expose a middle sub-portion of each portion of the etch stop layer 40 overlying one of the at least one first active area 30A. Further, two end sub-portions of each portion of the etch stop layer 40 overlying one of the at least one second active area 30B are also exposed. Substantially vertical edges of the second photoresist 77 cross a vertical extension of lengthwise edges of each of the at least one first active area 30A and the at least one second active area 30B.

The second photoresist 77 overlies widthwise edges of each of the at least one first active area 30A. The second photoresist 77 does not overlie widthwise edges of the at least one second active area 30B. The second photoresist 77 overlies end-portions of each of the at least one first active area 30A. The second photoresist 77 also overlies a middle portion of each of the at least one second active area 30B. The second photoresist 77 does not overlie a middle portion of the at least one first active area 30A. The second photoresist 77 does not overlie end-portions of the at least one second active area 30A. Thus, a middle portion of each of the at least one first active area 30A herein denotes a portion of the at least one first active area 30A that underlies an opening in the second photoresist 77. Likewise, a middle portion of each of the at least one second active area 30B herein denotes a portion of the at least one second active area 30B that underlies the photoresist 77.

Each middle portion of the at least one first active area 30A laterally abuts two end portions of the first active area 30A that contains the middle portion. Each middle portion of the at least one second active area 30B laterally abuts two end portions of the second active area 30B that contains the middle portion.

An anisotropic etch is performed to removed exposed portions of the prototype shallow trench isolation structure 70P employing the second photoresist 77 and the etch stop layer 40 as etch masks. As described above, the etch stop layer 40 has etch selectivity relative to the first shallow trench isolation material, which is the material of the prototype shallow trench isolation structure 70P. First cavities 68A are formed in the second device region 200 and second cavities 68B are formed in the first device region 100A as the first shallow trench isolation material is removed. The remaining portions of the prototype shallow trench isolation structure 70P constitute a first shallow trench isolation portion 70, which may comprise a plurality of disjoined sub-portions, i.e., a plurality of first shallow trench isolation sub-portions. Not necessarily but preferably, the anisotropic etch is selective to the buried insulator layer 20. In this case, a bottom surface of the first shallow trench isolation portion 70, bottom surfaces of the first cavities 68A, and bottom surfaces of the second cavities 68B are substantially at the same level, i.e., are substantially at the same depth from the top semiconductor surface 31.

Lengthwise sidewalls, i.e., sidewalls in the lengthwise direction, of the middle portion of each of the at least one first active area 30A are exposed, and laterally abut one of the second cavities 68B in the first device region 100. Lengthwise sidewalls and widthwise sidewalls, i.e., sidewalls in the widthwise direction, of the end portions of each of the at least one second active area 30B are exposed, and laterally abut one of the first cavities 68A in the second device region 200.

Referring to FIGS. 5A-5E, a second shallow trench isolation material is deposited into the first cavities 68A and the second cavities 68B, and is then planarized. The second shallow trench isolation material is then planarized by chemical mechanical polishing (CMP), a recess etch, or a combination thereof. When chemical mechanical planarization is employed, the etch stop layer 40 may be used as a stopping layer. When a recess etch is employed, the etch stop layer 40 may be use as an endpoint layer so that the recess etch may stop upon detection of exposure of the etch stop layer 40. At the end of planarization, the second shallow trench isolation material filling the first cavities 68A and the second cavities 68B constitutes a second shallow trench isolation portion 80. Preferably, a top surface of the second shallow trench isolation portion 80 is coplanar with the etch stop layer top surface 41, which is the top surface of the etch stop layer 40.

The first shallow trench isolation portion 70 and the second shallow trench isolation portion 80 collectively constitute a shallow trench isolation structure of the present invention. The first shallow trench isolation portion 70 may comprise a plurality of disjoined first shallow trench isolation sub-portions. The second shallow trench isolation portion 80 may comprise a plurality of disjoined second shallow trench isolation sub-portions.

The second shallow trench isolation material is different from the first shallow trench isolation material. The second shallow trench isolation material may be a stress-generating material or a non-stress-generating material that does not apply a substantial amount of stress to surrounding regions including the middle portion of each of the at least one first active area 30A and the end portions of each of the at least one second active area 30B. The measure of stress is the impact on mobility of charge carriers as described above.

At least one of the first shallow trench isolation portion 70 and the second shallow trench isolation portion 80 comprises a stress-generating material. In one case, the first shallow trench isolation material applies a first type of stress to the lengthwise sidewalls and the widthwise sidewalls of the end portions of the at least one first active area 30A and the lengthwise sidewalls of the middle portion of the at least one second active area 30B. The second shallow trench isolation material applies a second type of stress to the lengthwise sidewalls and the widthwise sidewalls of the end portions of the at least one second active area 30B and the widthwise sidewalls of the middle portions of the at least one first active area 30A. In this case, one of the first and second types is compressive and the other of the first and second types is tensile.

In another case, only one of the first shallow trench isolation material and the second shallow trench isolation material is a stress-generating material. The other of the first shallow trench isolation material and the second shallow trench isolation material is a non-stress-generating material, i.e., a material having an intrinsic stress less than 100 MPa such as undoped silicate glass (USG), borosilicate glass (BSG), phosphosilicate glass (PSG), fluorosilicate glass (FSG), and borophosphosilicate glass (BPSG). The stress-generating material may be a compress-stress-generating material such as a compress-stress-generating silicon nitride or a tensile-stress-generating material such as a tensile-stress-generating silicon nitride.

In one example, the first shallow trench isolation portion 70 comprises a tensile-stress-generating material and the second shallow trench isolation portion 80 comprises a non-stress-generating material. Stress effects of the first shallow trench isolation portion 70 and the second shallow trench isolation portion 80 in this example are shown schematically in arrows. A longitudinal tensile stress, i.e., a tensile stress along the lengthwise direction, is applied to each of the middle portion of the at least one first active area 30A. A longitudinal compressive stress, i.e., a compressive stress along the lengthwise direction, is applied to each of the middle portion of the at least one second active area 30B. A transverse tensile stress, i.e., a transverse stress along the widthwise direction, is applied to each of the middle portion of the at least one first active area 30A and each of the middle portion of the at least one second active area 30B. Embodiments in which the polarity of the longitudinal and transverse stresses is reversed are explicitly contemplated herein.

Embodiments in which each of the first shallow trench isolation portion 70 and the second shallow trench isolation portion 80 comprise a stress-generating material and the second shallow trench isolation portion 80 applies an opposite type of stress than the stress generated by the first shallow trench isolation portion 70 to amplify the stress effects of the example described above are explicitly contemplated herein.

Referring to FIGS. 6A-6E, the etch stop layer 40 is removed by an etch. The etch may be a wet etch, a reactive ion etch, a chemical downstream etch, or an isotropic dry etch. A gate stack comprising a gate dielectric 90 and a gate electrode 92 is formed on each middle portion of the at least one first active area 30A and each middle portion of the at least one second active area 30B. Gate spacers 94 may be formed by a conformal deposition of a dielectric layer followed by a reactive ion etch on sidewalls of each of the gate stack (90, 92).

A first channel C1 is formed in each of the middle portion of the at least one first active area 30A that vertically abuts a gate dielectric 90 in the first device region 100. The shallow trench isolation structure (70, 80) comprising the first shallow trench isolation portion 70 and the second shallow trench isolation portion 80 applies a first longitudinal stress along a lengthwise direction in the first channel C1 and a first transverse stress along a widthwise direction of the first channel C1.

A second channel C2 is formed in each of the middle portion of the at least one second active area 30B that vertically abuts a gate dielectric 90 in the second device region 100. The shallow trench isolation structure (70, 80) comprising the first shallow trench isolation portion 70 and the second shallow trench isolation portion 80 applies a second longitudinal stress along a lengthwise direction in the second channel C2 and a first transverse stress along a widthwise direction of the second channel C2.

Preferably, one of the first longitudinal stress and the second longitudinal stress is compressive, and the other of the first longitudinal stress and the second longitudinal stress is tensile. Preferably, the first transverse stress and the second transverse stress are both compressive or both tensile.

In one example, each of the at least one first active area 30A may comprise silicon, the first device region 100 may comprise at least one p-type field effect transistor, the first longitudinal stress may be a compressive stress, and the first transverse stress may be tensile. Both the first longitudinal stress and the first transverse stress enhance hole mobility in each of the at least one first active area 30A. At the same time, each of the at least one second active area 30B may comprise silicon, the second device region 200 may comprise at least one n-type field effect transistor, the second longitudinal stress may be a tensile stress, and the second transverse stress may be tensile. Both the second longitudinal stress and the second transverse stress enhance electron mobility in each of the at least one second active area 30B.

Referring to FIGS. 7A-7E, a second exemplary semiconductor structure according to a second embodiment of the present invention is shown. In the second embodiment, the first shallow trench isolation structure 70 laterally encloses the entirety of each of the at least one first active area 30A. The second exemplary semiconductor structure may be manufactured by employing identical processing steps as the first embodiment except that the entirety of the first device region 100 is covered by the second photoresist 77 after lithographic patterning of the second photoresist 77 at the step corresponding to FIGS. 4A-4E. Thus, only one group of active areas, i.e., the at least one second active areas 30B, is surrounded by a patterned shallow trench isolation structure having a heterogeneous composition.

As in the first embodiment, a first channel C1 is formed in each of the middle portion of the at least one first active area 30A that vertically abuts a gate dielectric 90 in the first device region 100. The first shallow trench isolation portion 70 comprising the first shallow trench isolation material applies a first longitudinal stress along a lengthwise direction in the first channel C1 and a first transverse stress along a widthwise direction of the first channel C1.

A second channel C2 is formed in each of the middle portion of the at least one second active area 30B that vertically abuts a gate dielectric 90 in the second device region 100. The shallow trench isolation structure (70, 80) comprising the first shallow trench isolation portion 70 and the second shallow trench isolation portion 80 applies a second longitudinal stress along a lengthwise direction in the second channel C2 and a first transverse stress along a widthwise direction of the second channel C2.

Preferably, one of the first longitudinal stress and the second longitudinal stress is compressive, and the other of the first longitudinal stress and the second longitudinal stress is tensile. Preferably, the first transverse stress and the second transverse stress are both compressive or both tensile.

In one example, each of the at least one first active area 30A may comprise silicon, the first device region 100 may comprise at least one p-type field effect transistor, the first longitudinal stress may be a compressive stress, and the first transverse stress may be tensile. Both the first longitudinal stress and the first transverse stress enhance hole mobility in each of the at least one first active area 30A. At the same time, each of the at least one second active area 30B may comprise silicon, the second device region 200 may comprise at least one n-type field effect transistor, the second longitudinal stress may be a tensile stress, and the second transverse stress may be tensile. Both the second longitudinal stress and the second transverse stress enhance electron mobility in each of the at least one second active area 30B.

Referring to FIGS. 8A-8E, a third exemplary semiconductor structure according to a third embodiment of the present invention is shown. The third exemplary semiconductor structure employs a bulk substrate 8' in which at least one first active area 30A' is formed in the first device region 100 and at least one second active area 30B' is formed in the second device region 200. Each of the at least one first active area 30A' and the at least one second active area 30B' denotes a portion of the bulk substrate 8' above a bottom surface of the shallow trench isolation structure containing a first shallow trench isolation portion 70 and the second shallow trench isolation portion 80. The third exemplary semiconductor structure may be manufactured by employing the same manufacturing methods as the first embodiment except for the replacement of the SOI substrate 8 with the bulk substrate 8'.

According to a fourth embodiment of the present invention, a fourth exemplary semiconductor structure (not shown) is derived from the second exemplary semiconductor structure by replacing the SOI substrate 8 with a bulk substrate as in the third embodiment and employing the same processing steps as in the second embodiment of the present invention.

Figure 9A:
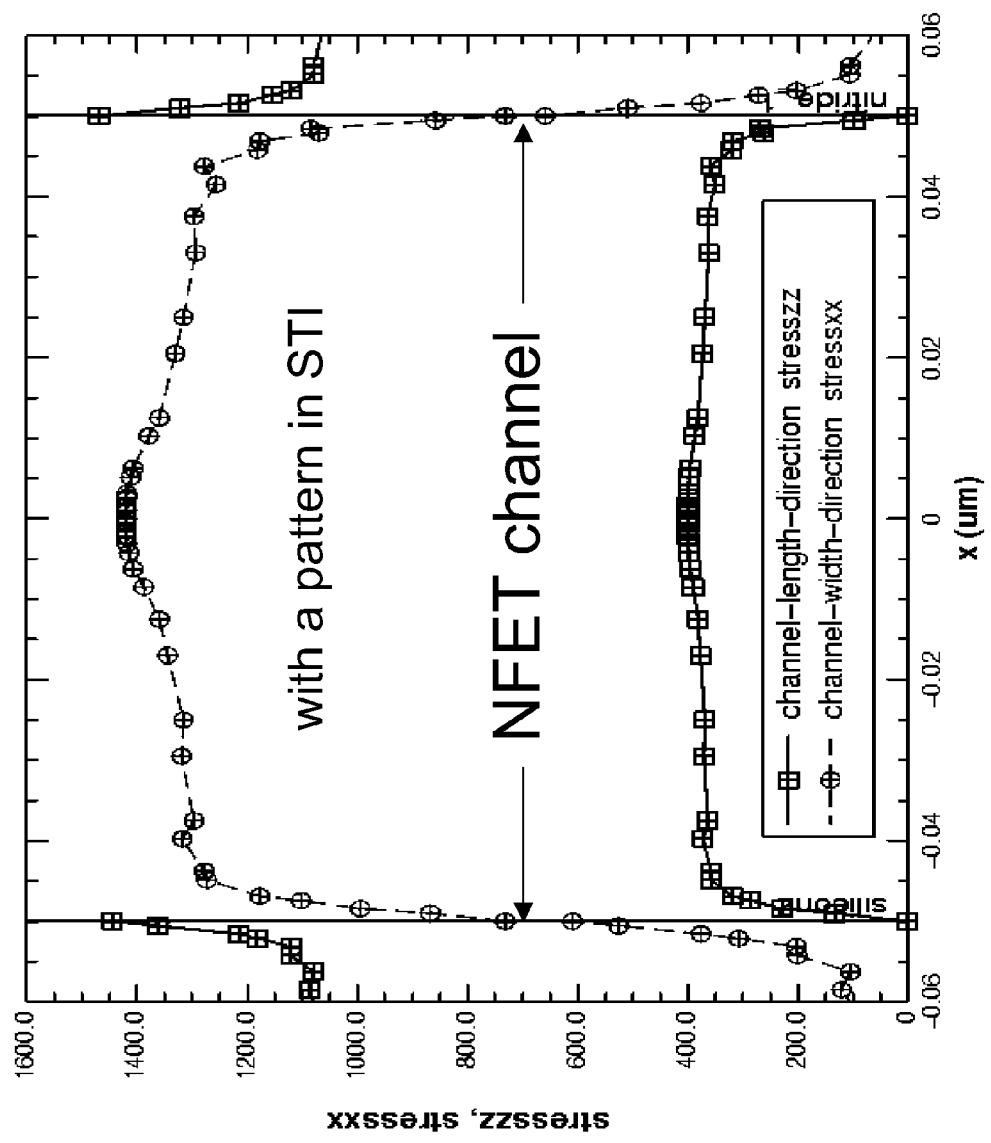
FIG. 9A is a result of a simulation for an n-type field effect transistor according to the third embodiment of the present invention.

Referring to FIG. 9A, a result of a simulation for longitudinal stress and transverse stress distribution at the center of a channel of an n-type field effect transistor according to the third embodiment of the present invention is shown. The simulation assumes a nested array of first active areas comprising silicon and having a width of 100 nm and a depth of 400 nm, which is the same as the depth of the first shallow trench isolation portion 70 and the second shallow trench isolation portion 80. Each of the first active areas constitutes an instance of the n-type field effect transistor. The first shallow trench isolation portion 70 comprises a tensile-stress-generating silicon nitride, which applies a tensile stress of about 1.5 GPa to surrounding regions that abut the first shallow trench isolation portion 70. The second shallow trench isolation portion 80 comprises a silicate glass and has an inherent stress level less than 100 MPa, and typically less than about 30 MPa.

The third exemplary semiconductor structure generates a longitudinal tensile stress of about 400 MPa and a transverse tensile stress of about 1.3 GPa in the channel of the n-type field effect transistor. Both stress components enhance electron mobility in the channel of the n-type field effect transistor.

Figure 9B:
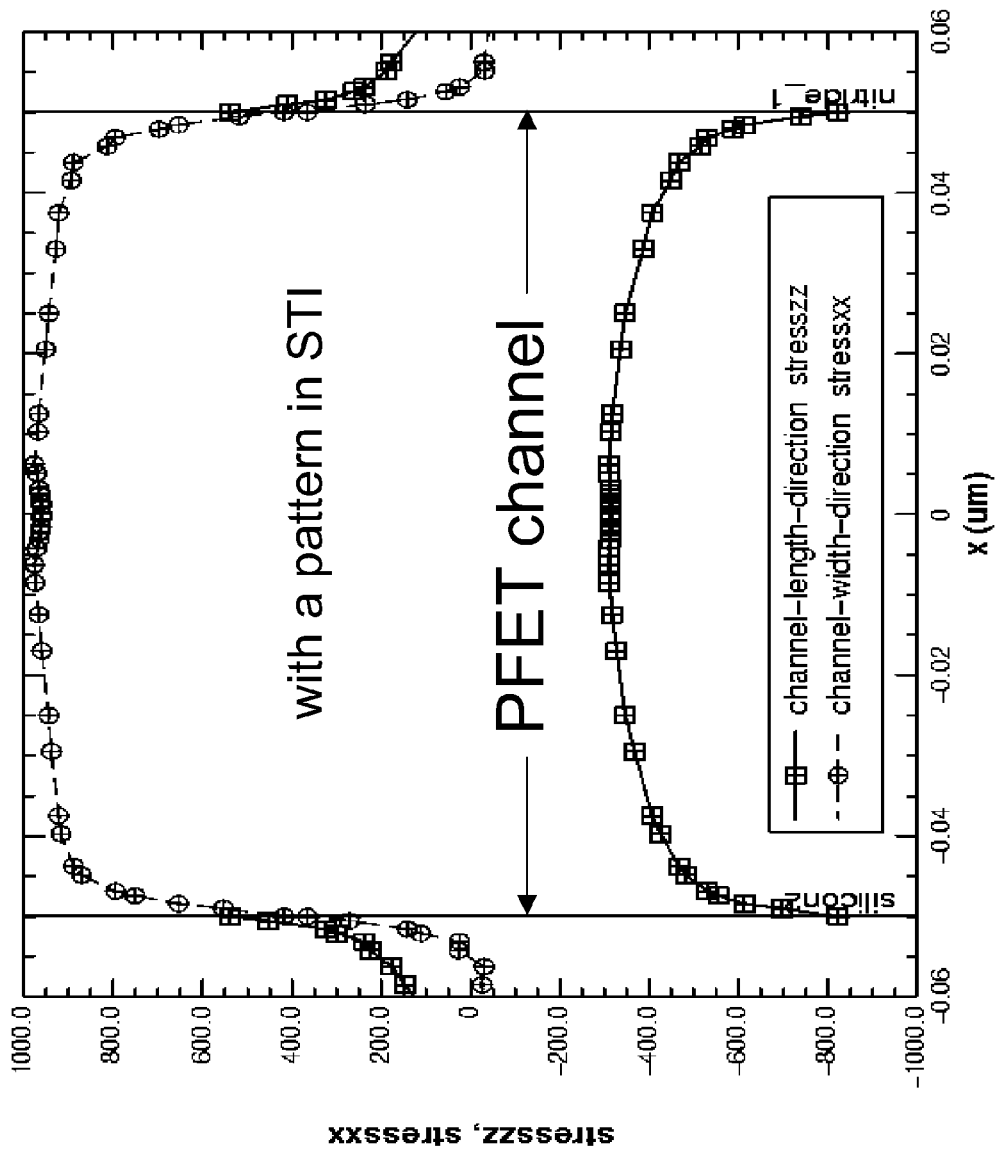
FIG. 9B is a result of a simulation for a p-type field effect transistor according to the third and fourth embodiments of the present invention.

Referring to FIG. 9B, a result of a simulation for a p-type field effect transistor according to the third and fourth embodiments of the present invention is shown. It is noted that the second device region 200 contains the same structure between the third exemplary semiconductor structure and the fourth exemplary semiconductor structure. The simulation assumes a nested array of second active areas comprising silicon and having a width of 100 nm and a depth of 400 nm, which is the same as the depth of the first shallow trench isolation portion 70 and the second shallow trench isolation portion 80. Each of the second active areas constitutes an instance of the p-type field effect transistor. The first shallow trench isolation portion 70 comprises a tensile-stress-generating silicon nitride, which applies a tensile stress of about 1.5 GPa to surrounding regions that abut the first shallow trench isolation portion 70. The second shallow trench isolation portion 80 comprises a silicate glass and has an inherent stress level less than 100 MPa, and typically less than about 30 MPa.

The third and fourth exemplary semiconductor structure generate a longitudinal compressive stress of about 400 MPa and a transverse tensile stress of about 950 MPa in the channel of the p-type field effect transistor. Both stress components enhance hole mobility in the channel of the p-type field effect transistor.

Figure 9C:
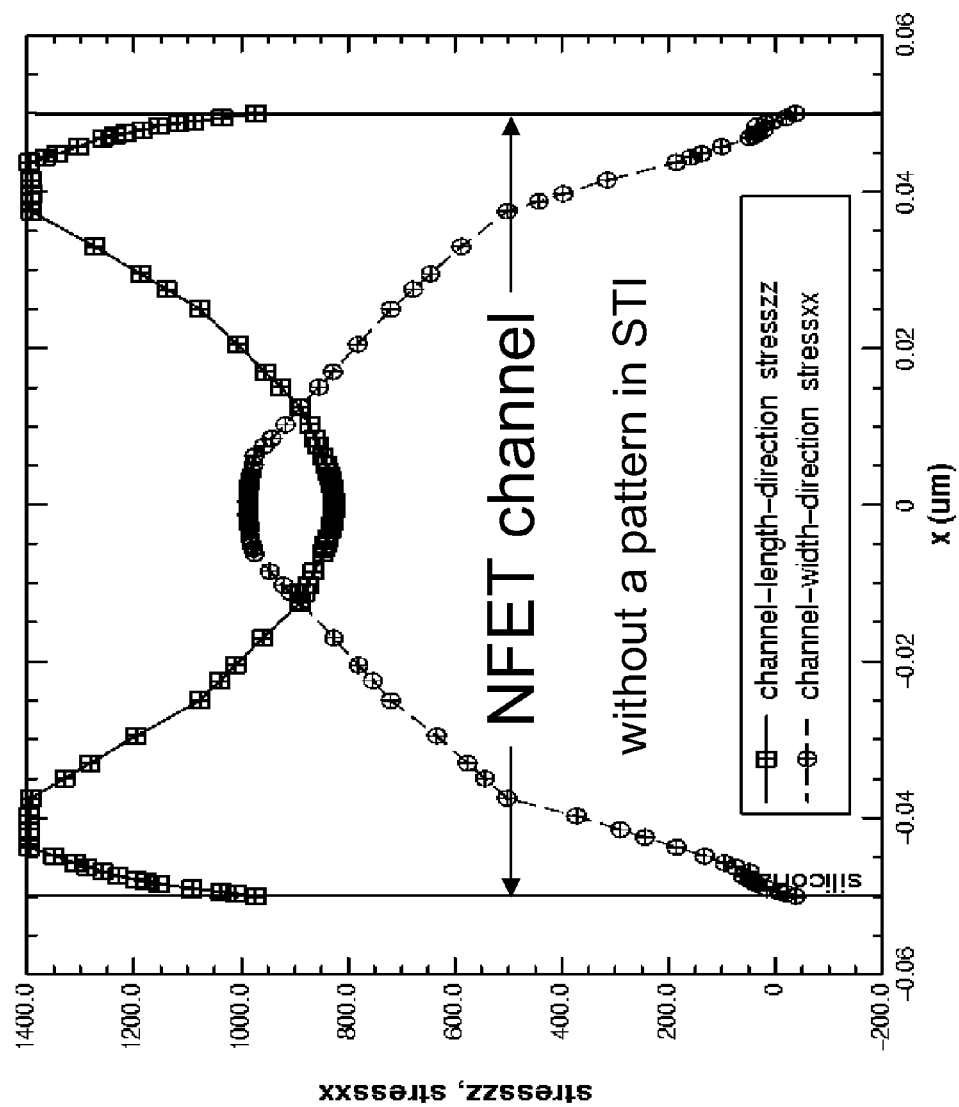
FIG. 9C is a result of a simulation for an n-type field effect transistor according to the fourth embodiment of the present invention.

Referring to FIG. 9C, a result of a simulation for an n-type field effect transistor according to the fourth embodiment of the present invention is shown. The simulation assumes a nested array of first active areas comprising silicon and having a width of 100 nm and a depth of 400 nm, which is the same as the depth of the first shallow trench isolation portion 70 and the second shallow trench isolation portion 80. In this case, the first shallow trench isolation portion 70 completely surrounds each of the first active areas, which constitutes an instance of the n-type field effect transistor. The first shallow trench isolation portion 70 comprises a tensile-stress-generating silicon nitride, which applies a tensile stress of about 1.5 GPa to surrounding regions that abut the first shallow trench isolation portion 70.

The fourth exemplary semiconductor structure generates a longitudinal tensile stress from about 800 MPa to about 1,400 MPa and a transverse tensile stress from about 0 MPa to about 1 GPa in the channel of the n-type field effect transistor. Both stress components enhance electron mobility in the channel of the n-type field effect transistor.

While the magnitude of an average longitudinal tensile stress increases over the equivalent magnitude of the third exemplary semiconductor structure, it is observed that the third exemplary semiconductor provides a more uniform longitudinal tensile stress distribution in the channel of the n-type field effect transistor. Further, an average transverse tensile stress on the n-type field effect transistor of the third exemplary semiconductor structure is greater than the average transverse tensile stress on the n-type field effect transistor of the fourth exemplary semiconductor structure. Further, the transverse tensile stress distribution is more uniform in the n-type field effect transistor of the third exemplary semiconductor structure than in the n-type field effect transistor of the fourth exemplary semiconductor structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a first active area and a second active area, each comprising a semiconductor material and located in a semiconductor substrate and disjoined from each other;
    a first shallow trench isolation portion laterally abutting lengthwise sidewalls and widthwise sidewalls of end portions of said first active area and laterally abutting lengthwise sidewalls of a middle portion of said second active area; and
    a second shallow trench isolation portion laterally abutting lengthwise sidewalls and widthwise sidewalls of end portions of said second active area and laterally abutting lengthwise sidewalls of a middle portion of said first active area.

2. The semiconductor structure of claim 1, wherein said first shallow trench isolation portion applies a first type of stress to said lengthwise sidewalls and said widthwise sidewalls of said end portions of said first active area and said lengthwise sidewalls of said middle portion of said second active area, and wherein said second shallow trench isolation portion applies a second type of stress to said lengthwise sidewalls and said widthwise sidewalls of said end portions of said second active area and said lengthwise sidewalls of said middle portion of said first active area, and wherein one of said first and second types is compressive and the other of said first and second types is tensile.

3. The semiconductor structure of claim 1, wherein said first shallow trench isolation portion and said second shallow trench isolation portion collectively enhance electron mobility along a lengthwise direction of said first active area and a hole mobility along a lengthwise direction of said second active area.

4. The semiconductor structure of claim 1, wherein said first shallow trench isolation portion comprises a tensile-stress-generating material and said second shallow trench isolation portion comprises a compressive-stress-generating material.

5. The semiconductor structure of claim 4, wherein said tensile-stress-generating material is a tensile-stress-generating silicon nitride, and wherein said compressive-stress-generating material is a compressive-stress-generating silicon nitride.

6. The semiconductor structure of claim 1, wherein said first shallow trench isolation portion comprises a compressive-stress-generating material and said second shallow trench isolation portion comprises a tensile-stress-generating material.

7. The semiconductor structure of claim 6, wherein said tensile-stress-generating material is a tensile-stress-generating silicon nitride, and wherein said compressive-stress-generating material is a compressive-stress-generating silicon nitride.

8. The semiconductor structure of claim 1, further comprising:
    a first gate dielectric and a first gate electrode located on said first active area; and
    a second gate dielectric and a second gate electrode located on said second active area.

9. The semiconductor structure of claim 8, further comprising:
    a first channel located in said first active area and vertically abutting said first gate dielectric, wherein said first shallow trench isolation portion and said second shallow trench isolation portion apply a first longitudinal stress along a lengthwise direction in said first channel and a first transverse stress along a widthwise direction of said first channel; and
    a second channel located in said second active area and vertically abutting said second gate dielectric, wherein said first shallow trench isolation portion and said second shallow trench isolation portion apply a second longitudinal stress along a lengthwise direction in said second channel and a second transverse stress along a widthwise direction of said second channel.

10. The semiconductor structure of claim 8, wherein one of said first longitudinal stress and said second longitudinal stress is compressive, and wherein the other of said first longitudinal stress and said second longitudinal stress is tensile, and wherein said first transverse stress and said second transverse stress are both compressive or both tensile.

11. The semiconductor structure of claim 1, wherein the first and second active areas comprise a single crystalline semiconductor material.

12. The semiconductor structure of claim 1, wherein the first active area is a first portion of a top semiconductor layer of a semiconductor-on-insulator (SOI) substrate, and the second active area is a second portion of the top semiconductor layer of the semiconductor-on-insulator (SOI) substrate.

13. The semiconductor structure of claim 1, wherein said first active area is a first portion of a bulk semiconductor substrate, and the second active area is a second portion of the bulk semiconductor substrate.

14. The semiconductor structure of claim 1, wherein said first shallow trench isolation portion and each of said second shallow trench isolation portions have substantially the same depth.

15. The semiconductor structure of claim 1, the second shallow trench isolation portion comprises two disjoined second shallow trench isolation sub-portions, each of which laterally abuts the first shallow trench isolation portion.

* * * * *